US012813364B2

(12) United States Patent
Scholz et al.

(10) Patent No.: US 12,813,364 B2
(45) Date of Patent: Nov. 24, 2026

(54) PACKAGE WITH TRANSISTOR CHIP BETWEEN CARRIER AND CONDUCTIVE STRUCTURE AND WITH THERMALLY CONDUCTIVE ELECTRICALLY INSULATING LAYER

(71) Applicant: Infineon Technologies AG, Neubiberg (DE)

(72) Inventors: Wolfgang Scholz, Olching (DE); Marcus Böhm, Mintraching (DE); Bernd Richard Schmölzer, Radenthein (AT); Andre Rainer Stegner, Ottobrunn (DE); Lisa Marie Holzmann, Munich (DE); Thorsten Scharf, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 294 days.

(21) Appl. No.: 18/781,582

(22) Filed: Jul. 23, 2024

(65) Prior Publication Data

US 2025/0079275 A1 Mar. 6, 2025

(30) Foreign Application Priority Data

Sep. 5, 2023 (DE) ..................... 10 2023 123 825.6

(51) Int. Cl.
*H01L 23/498* (2006.01)
*H10W 40/22* (2026.01)
(Continued)

(52) U.S. Cl.
CPC ....... *H10W 90/701* (2026.01); *H10W 40/226* (2026.01); *H10W 70/411* (2026.01);
(Continued)

(58) Field of Classification Search
CPC ... H10W 90/701; H10W 74/10; H10W 74/01; H10W 70/65; H10W 70/411; H10W 40/226
See application file for complete search history.

(56) References Cited

U.S. PATENT DOCUMENTS

2006/0039118 A1* 2/2006 Jafari .................... H10W 40/43 361/719
2011/0241189 A1 10/2011 Sirinorakul
(Continued)

FOREIGN PATENT DOCUMENTS

| | | |
|---|---|---|
| JP | 2001-308263 | 11/2001 |
| JP | 2008-053748 | 3/2008 |
| JP | 2013-73945 | 4/2013 |

OTHER PUBLICATIONS

English Machine Translation of JP 2008/053748 (Year: 2008).*

*Primary Examiner* — Dzung Tran
(74) *Attorney, Agent, or Firm* — DBC Law Group, PLLC

(57) ABSTRACT

A package is disclosed. In one example, the package comprises a carrier, a first chip with an integrated transistor and comprising a first terminal attached on the carrier, a second terminal, and a third terminal, wherein the first terminal and the third terminal are formed on one main surface of the first chip and the second terminal is formed on an opposing other main surface of the first chip. A conductive structure is attached on the second terminal, an encapsulant is at least partially encapsulating the carrier, the first chip, and the conductive structure, and an insulating layer is arranged on a surface portion of the conductive structure or of the carrier. The surface portion is exposed beyond the encapsulant.

32 Claims, 9 Drawing Sheets

(51) Int. Cl.

*H10W 70/40* (2026.01)
*H10W 70/65* (2026.01)
*H10W 74/01* (2026.01)
*H10W 74/10* (2026.01)
*H10W 90/00* (2026.01)
*H10W 72/00* (2026.01)

(52) U.S. Cl.

CPC ........... *H10W 70/65* (2026.01); *H10W 74/01* (2026.01); *H10W 74/10* (2026.01); *H10W 72/871* (2026.01); *H10W 90/00* (2026.01); *H10W 90/756* (2026.01); *H10W 90/762* (2026.01); *H10W 90/766* (2026.01)

(56) References Cited

U.S. PATENT DOCUMENTS

| | | | |
|---|---|---|---|
| 2019/0051742 | A1 | 2/2019 | Riegler et al. |
| 2020/0273781 | A1 | 8/2020 | Scharf et al. |
| 2021/0020550 | A1 | 1/2021 | Chiang et al. |

* cited by examiner

PACKAGE WITH TRANSISTOR CHIP BETWEEN CARRIER AND CONDUCTIVE STRUCTURE AND WITH THERMALLY CONDUCTIVE ELECTRICALLY INSULATING LAYER

CROSS-REFERENCE TO RELATED APPLICATION

This Utility Patent Applications claims priority to German Patent Application No. 10 2023 123 825.6 filed Sep. 5, 2023, which is incorporated herein by reference.

BACKGROUND OF THE INVENTION

Field of the Invention

The present invention relates to a package and to a method of manufacturing a package.

Description of the Related Art

A package, for instance for automotive applications, provides a physical containment for one or more electronic chips comprising one or more integrated circuit elements. Examples of integrated circuit elements of packages are a metal oxide semiconductor field effect transistor (MOSFET), an insulated-gate bipolar transistor (IGBT), and a diode.

There is still potentially room to improve electric performance and thermal reliability of a package.

SUMMARY OF THE INVENTION

There may be a need for a package with high electrical performance and thermal reliability.

According to an exemplary embodiment, a package is provided which comprises a carrier, a first chip with an integrated transistor and comprising a first terminal attached on the carrier, a second terminal, and a third terminal, wherein the first terminal and the third terminal are formed on one main surface of the first chip and the second terminal is formed on an opposing other main surface of the first chip, wherein the first terminal is a source or emitter terminal, the second terminal is a drain or collector terminal, and the third terminal is a gate or base terminal, a conductive structure being at least partially electrically conductive and being attached on the second terminal, an encapsulant at least partially encapsulating the carrier, the first chip, and the conductive structure, and an insulating layer arranged on a surface portion of the conductive structure or of the carrier, which surface portion is exposed beyond the encapsulant, wherein the insulating layer is thermally conductive and electrically insulating.

According to another exemplary embodiment, a method of manufacturing a package is provided, wherein the method comprises attaching a first terminal of a first chip, which has an integrated transistor, on a carrier, providing the first chip with a second terminal, and a third terminal, wherein the first terminal and the third terminal are formed on one main surface of the first chip and the second terminal is formed on an opposing other main surface of the first chip, wherein the first terminal is a source or emitter terminal, the second terminal is a drain or collector terminal, and the third terminal is a gate or base terminal, attaching a conductive structure, being at least partially electrically conductive, on the second terminal, at least partially encapsulating the carrier, the first chip, and the conductive structure by an encapsulant, and arranging an insulating layer on a surface portion of the conductive structure or of the carrier, which surface portion is exposed beyond the encapsulant, wherein the insulating layer is thermally conductive and electrically insulating.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION OF EXEMPLARY EMBODIMENTS

Figure 1:
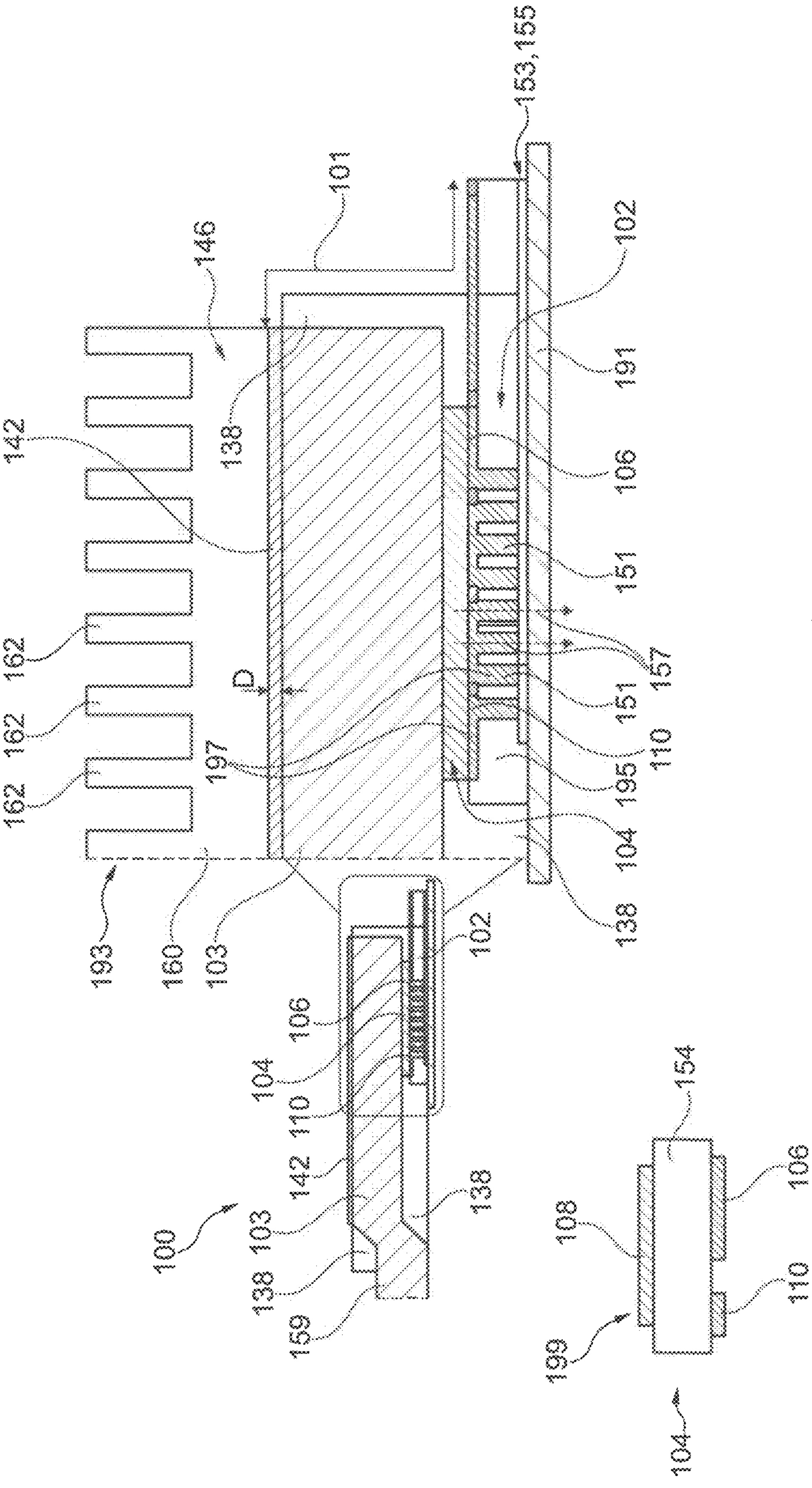
FIG. 1 shows a cross-sectional view of a package, and a detail thereof, according to an exemplary embodiment.

There may be a need for a package with high electrical performance and thermal reliability.

According to an exemplary embodiment, a package is provided which comprises a carrier, a first chip with an integrated transistor and comprising a first terminal attached on the carrier, a second terminal, and a third terminal, wherein the first terminal and the third terminal are formed on one main surface of the first chip and the second terminal is formed on an opposing other main surface of the first chip, wherein the first terminal is a source or emitter terminal, the second terminal is a drain or collector terminal, and the third terminal is a gate or base terminal, a conductive structure being at least partially electrically conductive and being attached on the second terminal, an encapsulant at least partially encapsulating the carrier, the first chip, and the conductive structure, and an insulating layer arranged on a surface portion of the conductive structure or of the carrier, which surface portion is exposed beyond the encapsulant, wherein the insulating layer is thermally conductive and electrically insulating.

According to another exemplary embodiment, a method of manufacturing a package is provided, wherein the method comprises attaching a first terminal of a first chip, which has an integrated transistor, on a carrier, providing the first chip with a second terminal, and a third terminal, wherein the first terminal and the third terminal are formed on one main surface of the first chip and the second terminal is formed on an opposing other main surface of the first chip, wherein the first terminal is a source or emitter terminal, the second terminal is a drain or collector terminal, and the third terminal is a gate or base terminal, attaching a conductive structure, being at least partially electrically conductive, on the second terminal, at least partially encapsulating the carrier, the first chip, and the conductive structure by an encapsulant, and arranging an insulating layer on a surface portion of the conductive structure or of the carrier, which surface portion is exposed beyond the encapsulant, wherein the insulating layer is thermally conductive and electrically insulating.

According to an exemplary embodiment, an encapsulated package comprises a carrier, a conductive structure and a first chip which may be embodied as a field-effect transistor chip or as a bipolar transistor chip. Two chip terminals may be located on one side of the first chip, whereas a third terminal may be located on the opposing other side of the first chip. Advantageously, a thin insulating layer providing thermal conductivity may be arranged on an exposed surface portion of the conductive structure or of the carrier. Such a thin thermally conductive and electrically insulating layer may reliably electrically insulate carrier or conductive structure with respect to an exterior of the package and may at the same time contribute to heat removal out of an interior of the package when the encapsulated first chip creates heat during operation. Advantageously, the first chip may be arranged in a source-down (or emitter-down) configuration, wherein the thin insulating layer can be put on an exposed carrier (such as a leadframe) or conductive structure (such as a clip). Such a configuration may provide a package with excellent electrical and thermal reliability which can be manufactured with a compact design.

If, in an embodiment, the one of the conductive structure or the carrier on which the insulating layer is arranged is controlled to be at fixed potential during package operation, this may efficiently suppress capacitive coupling with a metallic heat sink which may be attached to an opposing other side of the insulating layer. As a consequence, the package may be manufactured in a simple and compact way with a thin insulating layer providing a proper performance. More specifically, with a fixed potential on such a capacitor, an induced current and EMI (electromagnetic interference) may be suppressed or even prevented.

DESCRIPTION OF FURTHER EXEMPLARY EMBODIMENTS

In the following, further exemplary embodiments of the package and the method will be explained.

In the context of the present application, the term "package" may particularly denote a device which may comprise for example one or two chips mounted on a (in particular partially or entirely electrically conductive) carrier. Said constituents of the package may be optionally encapsulated at least partially by an encapsulant. Furthermore, a connection structure may form part of the package.

In the context of the present application, the term "carrier" may particularly denote a support structure (which may be at least partially electrically conductive) which serves as a mechanical support for the electronic chip(s) to be mounted thereon, and which may also contribute to the electric interconnection between the electronic chip(s) and the periphery of the package. In other words, the carrier may fulfil a mechanical support function and an electric connection function. A carrier may comprise or consist of a single part, multiple parts joined via encapsulation or other package components, or a subassembly of carriers. When the carrier forms part of a leadframe, it may be or may comprise a die pad. For instance, such a carrier may be a leadframe structure (for instance made of copper), a DAB (Direct Aluminum Bonding) substrate, a DCB (Direct Copper Bonding) substrate, etc. Moreover, the carrier may also be configured as Active Metal Brazing (AMB) substrate.

In the context of the present application, the term "chip" may in particular denote a semiconductor chip (in particular a power semiconductor chip). The chip may be an active electronic device. In particular, the chip may be a semiconductor chip having at least one integrated circuit element (such as a transistor) in a surface portion thereof. The chip may be a bare die or may be already packaged or encapsulated. Semiconductor chips implemented according to exemplary embodiments may be formed for example in silicon technology, gallium nitride technology, silicon carbide technology, etc.

In the context of the present application, the term "chip with integrated transistor" may in particular denote a chip, such as a semiconductor chip, in which at least a transistor may be integrated, in particular monolithically integrated. Optionally, the chip may comprise at least one further integrated circuit element, such as a diode or a further transistor. In particular, a respective chip with integrated transistor may be a field-effect transistor chip having a source terminal (or pad), a drain terminal (or pad) and a gate terminal (or pad). Alternatively, a respective chip with integrated transistor may be a bipolar transistor chip having an emitter terminal (or pad), a collector terminal (or pad) and a base terminal (or pad). Specific examples of the transistor chips are a metal oxide semiconductor field effect transistor (MOSFET), and an insulated-gate bipolar transistor (IGBT).

In the context of the present application, the term "conductive structure" may particularly denote one or more electrically conductive bodies or elements. Hence, a conductive structure may be composed of one or more electrically conductive elements (such as metallic pillars, bumps, and/or clips) and may be implemented in a package, for instance for electrically coupling and/or mechanically supporting one or more chips. Preferably, the conductive structure may comprise one or two clips. A "clip" may particularly denote a three-dimensionally curved connection element which comprises an electrically conductive material such as copper and is an integral body with sections to be connected to chip terminals and/or a chip carrier and/or leads.

In the context of the present application, the term "encapsulant" may particularly denote a material, structure or member surrounding at least part of the transistor chip(s) and at least part of a carrier to provide mechanical protection, and optionally electrical insulation and/or a contribution to heat removal during operation. In particular, said encapsulant may be predominantly or even entirely electrically insulating, for instance a mold compound. A mold compound may comprise a matrix of flowable and hardenable material and filler particles embedded therein. For instance, filler particles may be used to adjust the properties of the mold component, in particular to enhance thermal conductivity. As an alternative to a mold compound (for example on the basis of epoxy resin), the encapsulant may also be a potting compound (for instance on the basis of a silicone gel).

In the context of the present application, the term "insulating layer" may particularly denote a flat film having electrically insulating properties. At the same time, the insulating layer may be thermally conductive, i.e. may be capable of conducting heat. The insulating layer may be embodied as a single insulating film, for instance may be a monolayer. Alternatively, the insulating layer may be a stack of two or more electrically insulating materials. The insulating layer may also be composed of at least two separate island-shaped insulating elements or sections. For instance, the insulating layer may comprise a ceramic, an organic material, a thermal interface material and/or an electrically insulating foil (for instance made of Kapton).

In the context of the present application, the term "main surface" of a body may particularly denote a largest body surface of one of the largest body surfaces. For instance, a body (such as a clip or a carrier or a chip or part thereof) may be plate-shaped or substantially plate-shaped and may then have two opposing main surfaces separated by body material in a thickness direction and connected with each other by a circumferential edge. For example, one main surface of a body may be at least partially exposed. Additionally or alternatively, one main surface (for instance another main surface) of a body may be connected to one or more chips.

In an embodiment, the carrier comprises a leadframe structure or a laminate, for example a printed circuit board (PCB).

In the context of the present application, the term "leadframe" may particularly denote a sheet-like metallic structure which can be bent, punched and/or patterned so as to form leadframe bodies as mounting sections for mounting chips, and connection leads for electric connection of the package to an electronic environment. In an embodiment, the leadframe may be a metal plate (in particular made of copper) which may be patterned, for instance by stamping or etching. Forming the chip carrier as a leadframe is a cost-efficient and mechanically as well as electrically highly advantageous configuration in which a low ohmic connection of chips can be combined with a robust support capability of the leadframe. Furthermore, a leadframe may contribute to the thermal conductivity of the package and may remove heat generated during operation of the chip(s) as a result of the high thermal conductivity of the metallic (in particular copper) material of the leadframe.

In the context of the present application, the term "laminate" may particularly denote a carrier formed as a stack of a plurality of interconnected layers, such as metal foils or deposited metal layers and dielectric layers, for example comprising a resin. A laminate may be formed by heating and/or pressing together the individual layers, for instance for curing resin and thereby interconnecting the individual layers. An example of a laminate is a PCB.

In an embodiment, the carrier has an electrical routing structure extending between two opposing main surfaces of the carrier and connecting the first terminal with a first terminal lead and the third terminal with a third terminal lead. For example, metallic through connections may be formed to extend vertically through the carrier. Such through connections may comprise, for example, stacked metallic vias and/or metal pillars. The electrical routing structure may also comprise horizontal metallic sections, for example of a patterned metal layer. The electrical routing structure may allow to conduct current along a short and well-defined path vertically through the carrier for provision at its bottom main surface. In such an embodiment, the package may be an SMD (surface mounted device) package, with source and gate terminals at the bottom.

In an embodiment, at least part of the first terminal lead and the third terminal are exposed with respect to the encapsulant for attachment to a mounting base, for example a printed circuit board (PCB). In a single chip package, a mounting base such as a (for example further) PCB may be provided at a bottom side of the carrier for further processing signals from the first and third terminals provided at first and third terminal leads, respectively. This may contribute to a compact design of the package and to a low loss transmission of electrical signals.

In an embodiment, the carrier comprises at least one thermal channel for dissipating heat from the first chip to a side of the carrier facing away from the conductive structure. In addition to its electrical routing capability, the carrier may also be provided with an array of parallel thermal vias (for instance filled with copper) or the like, which extend vertically through the carrier for removing heat created by the encapsulated chip during operation of the package. This may improve the thermal performance of the package.

In an embodiment, the conductive structure comprises a leadframe structure or a clip. Preferably, the conductive structure comprises one integrated clip or two separate clips for attachment to a respective side of the one or more chips.

In an embodiment, the conductive structure protrudes from the encapsulant and functions as a second terminal lead (i.e. for connection with the drain terminal). Thus, the conductive structure may not only be coupled with the one or more chips, but may also provide the additional function of one or more leads extending out of the encapsulant and allowing to couple the first chip's second terminal, being connected with the conductive structure, with an exterior periphery of the package.

In an embodiment, the package comprises a heat sink attached on the insulating layer. An appropriate heat sink may be a heat dissipation body, which may be made of a highly thermally conductive material such as copper or aluminum. For instance, such a heat sink may have a base body facing said insulating layer and may have a plurality of cooling fins extending from the base body and in parallel to each another so as to remove the heat towards the environment.

In an embodiment, the package comprises a second chip with an integrated transistor and comprising a fourth terminal, a fifth terminal attached on the carrier and a sixth terminal, wherein the fourth terminal and the sixth terminal are formed on one main surface of the second chip and the fifth terminal is formed on an opposing other main surface of the second chip, wherein the fourth terminal is a source or emitter terminal, the fifth terminal is a drain or collector terminal, and the sixth terminal is a gate or base terminal, wherein the conductive structure is attached on the fourth terminal, and wherein the encapsulant encapsulates at least part of the second chip. To put it shortly, a second chip, electrically coupled with the first chip, may be provided and may be embodied as a further field-effect transistor chip or as a further bipolar transistor chip. The fifth terminal, i.e. the drain (or collector) terminal, of the second chip may be attached to the carrier. This may lead to the combination of a source-down first chip and a drain-down second chip.

Furthermore, one of the first chip and the second chip may be a high-side chip and the other one may be a low-side chip of a half bridge, whereas other applications may be possible. When combining a source-down first chip and a drain-down second chip, the first terminal of the (for example low-side) first chip and the fifth terminal of the (for instance high-side) second chip may be coupled with the carrier being covered by a very thin insulating layer. A benefit of such a configuration results from the fact that the first terminal and the fifth terminal may have fixed-potentials when the package is in operation, so that an external heat sink can be attached on top of a very thin insulating layer without the risk of electric breakdown. In a half-bridge package, the second chip may be a drain down die.

In an embodiment, the carrier comprises a first die pad on which the first chip is mounted and comprises a separate second die pad on which the second chip is mounted, wherein the first die pad and the second die pad comprise an electrically conductive material. Preferably, the first die pad and the second die pad form part of a leadframe structure. For instance, the first die pad and the second die pad may form part of the same leadframe structure but may be physically and electrically separate from each other. This allows to apply different electric potentials to the first die pad and to the second die pad.

In an embodiment, the insulating layer comprises a first insulating layer section on the first die pad and comprises a separate second insulating layer section on the second die pad. When providing different insulating layer sections for the first die pad and the second die pad, the insulating layer needs to be provided only where needed, which contributes to the compactness of the package. Moreover, the different insulating layer sections may be adjusted separately to properly comply with their individual requirements.

In another embodiment, the insulating layer is a single integral layer extending over the first die pad and over the second die pad. This may allow to manufacture the package with low effort, since only a single integral insulating layer needs to be manufactured, without the need of patterning or the like. Furthermore, this may allow to obtain homogeneous electric isolation properties for both die pads. For example, the single integral insulating layer may cover two fixed potential (DC+ and DC−) die pads in FIG. 5.

In an embodiment, in operation of the package in a half-bridge configuration, the second terminal and the fourth terminal are configured as a switch node of the package and therefore have a floating potential, the first terminal and the fifth terminal are configured to have fixed potentials, and the insulating layer is arranged on the first die pad and the exposed second die pad having the fixed potentials and being at least partially exposed from the encapsulant. Thus, each of the chips may comprise a fixed potential terminal (i.e. the first terminal of the first chip and the fifth terminal of the second chip) located on the chip carrier and a floating potential terminal (i.e. the second terminal of the first chip and the fourth terminal of the second chip) facing away from the chip carrier and being connected with the conductive structure. In such a scenario, the thermally conductive and electrically insulating layer, being arranged on an exposed surface portion of the chip carrier, may be formed with a very low thickness of for instance in a range from 10 μm to 100 μm. This is due to the fact that the insulating layer faces the fixed potentials side of the chips, which side is less prone to electric breakdown. Consequently, a very thin insulating layer may be sufficient for such a package configuration. With carrier (or conductive structure), insulating layer and external heat sink, a parasitic capacitor is formed. With a fixed DC potential on the capacitor, an induced current and EMI (electromagnetic interference) may be suppressed or even prevented.

Figure 6:
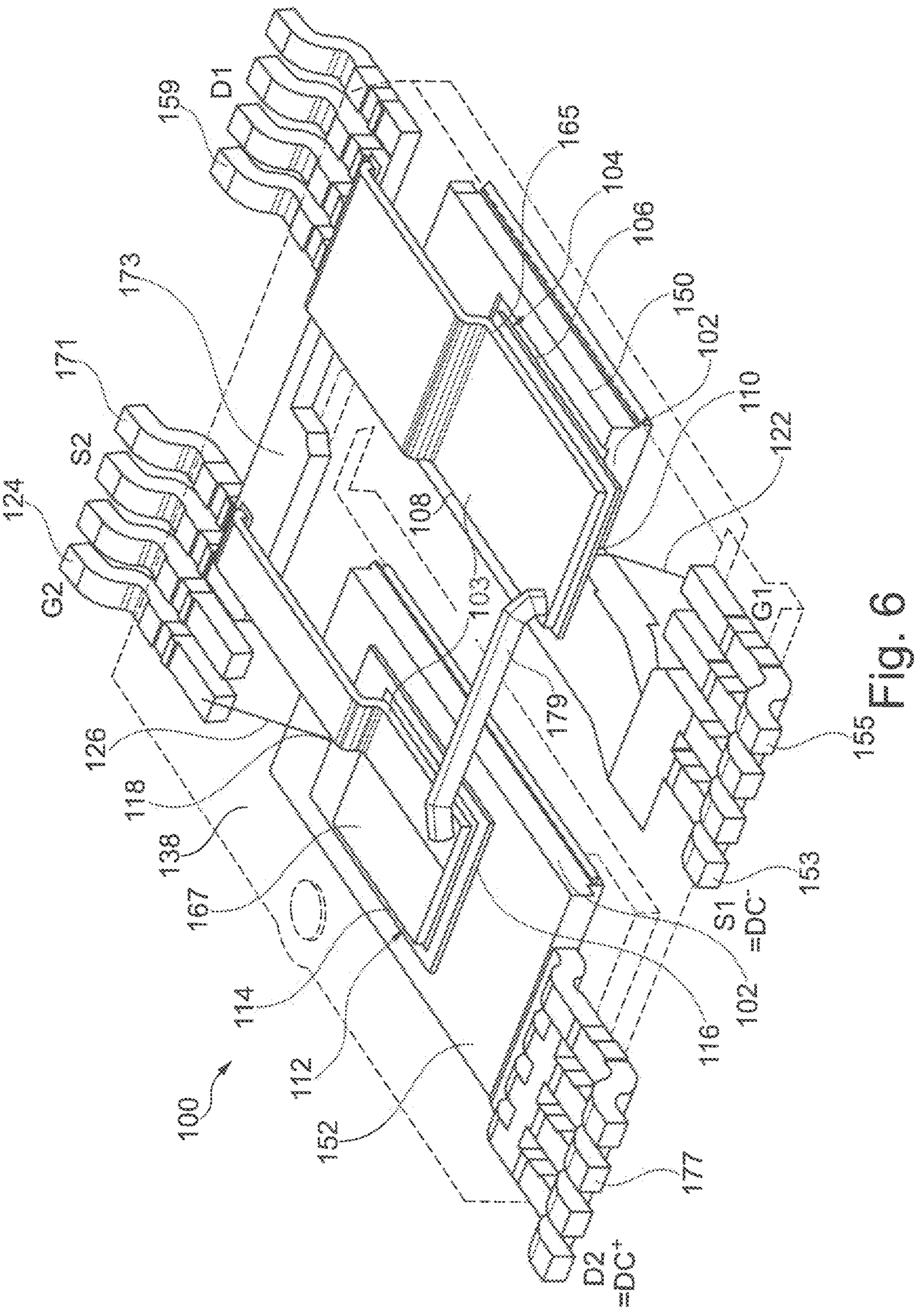
FIG. 6 shows a three-dimensional transparent view of the package according to FIG. 5.

In an embodiment, the conductive structure comprises a conductive element connected with the first chip and a further conductive element connected with the second chip, wherein the package further comprises a second terminal lead, a fourth terminal lead, and a connecting element, wherein the conductive element is connected to the second terminal lead, wherein the further conductive element is attached on the fourth terminal and is connected to the fourth terminal lead, and wherein the connecting element is embedded inside the encapsulant and connects the second terminal lead to the fourth terminal lead via an inside of the package. For instance, a corresponding embodiment is shown in FIG. 6. In such a configuration, each of the chips may be provided with a separate conductive element, wherein the electric coupling between the conductive elements may be accomplished by a leads connecting element arranged encapsulated within the encapsulant. Such an approach allows to couple the individual conductive elements with short electric path and small manufacturing effort.

In an embodiment, the second terminal lead and the fourth terminal lead are arranged at a first side of the package, and a first terminal lead and a fifth terminal lead are arranged at an opposite second side of the package. Such a design may lead to a large spatial distance between the mentioned leads at the two opposing sides of the package, which may suppress an undesired electric interaction in between.

In an embodiment, at least one of the conductive element and the further conductive element comprises a clip. Hence, two separate clips may be provided for forming the conductive elements with reasonable effort.

In an embodiment, the package comprises a direct connection structure arranged to directly electrically connect the second terminal and the fourth terminal inside the encapsulant. For instance, such a direct connection structure may be embodied as a metallic loop for providing a short electric path between the second terminal and the fourth terminal.

In an embodiment, the conductive structure comprises an integrated clip contacting the second terminal and the fourth terminal. In such a configuration, which is shown for instance in FIG. 8 and FIG. 9, the conductive structure may be embodied as continuous integral electrically conductive body. This keeps the wiring effort inside the package low.

In an embodiment, the carrier comprises an integrated die pad of a leadframe, wherein the first terminal and the fifth terminal are attached to the integrated die pad, wherein the integrated die pad protrudes out of the encapsulant and forms a first terminal lead and a fifth terminal lead of the package, wherein a conductive element of the conductive structure is attached to the second terminal and is connected to a second terminal lead, and wherein a further conductive element of the conductive structure is attached to the fourth terminal and is connected to a fourth terminal lead. In such a configuration, which is shown for instance in FIG. 12, the carrier may be embodied as continuous integral electrically conductive body. This keeps the wiring effort inside the package low.

In an embodiment, at least part of the conductive element and the further conductive element are exposed with respect to the encapsulant, wherein the insulating layer covers an exposed surface of the conductive element and of the further conductive element. By exposing the conductive structure or part thereof with respect to the encapsulant, and by covering the exposed surface with the insulating layer, both a high electric reliability and a high thermal performance may be achieved simultaneously due to the heat removal capability of the conductive structure being located very close to an exterior surface of the package. A heat sink may be attached on such a dielectric layer to further increase the thermal performance.

In an embodiment, the insulating layer comprises a first insulating layer section on the conductive element and comprises a separate second insulating layer section on the further conductive element. When providing different insulating layer sections for the conductive element and the further conductive element, the insulating layer needs to be provided only where needed, which contributes to the compactness of the package. Moreover, the different insulating layer sections may be adjusted separately to properly comply with their individual requirements.

In an embodiment, when operating the package in a half-bridge configuration of the first chip and the second chip, the first terminal lead and the fifth terminal lead are configured as switch nodes and have a floating potential, and wherein the package comprises a second terminal lead connected to the conductive element and comprises a fourth terminal lead connected to the further conductive element, the second terminal lead and the fourth terminal lead having fixed potentials. Thus, each of the chips may comprise a fixed potential terminal (i.e. the second terminal of the first chip and the fourth terminal of the second chip) located on the conductive structure and a floating potential terminal (i.e. the first terminal of the first chip and the fifth terminal of the second chip) facing away from the conductive structure and being connected with the carrier. In such a scenario, the thermally conductive and electrically insulating layer, being arranged on an exposed surface portion of the conductive structure, may be formed with a very low thickness in a range from 10 μm to 100 μm. This is due to the fact that the insulating layer faces the fixed potentials side of the chips, which side is less prone to electric breakdown. Consequently, a very thin insulating layer may be sufficient for such a package configuration. With a fixed potential on a capacitor formed by the insulating layer having the carrier or the conductive structure on one side and having a heat sink on the other side, an induced current and electromagnetic interference may be suppressed or even prevented.

Figure 10:
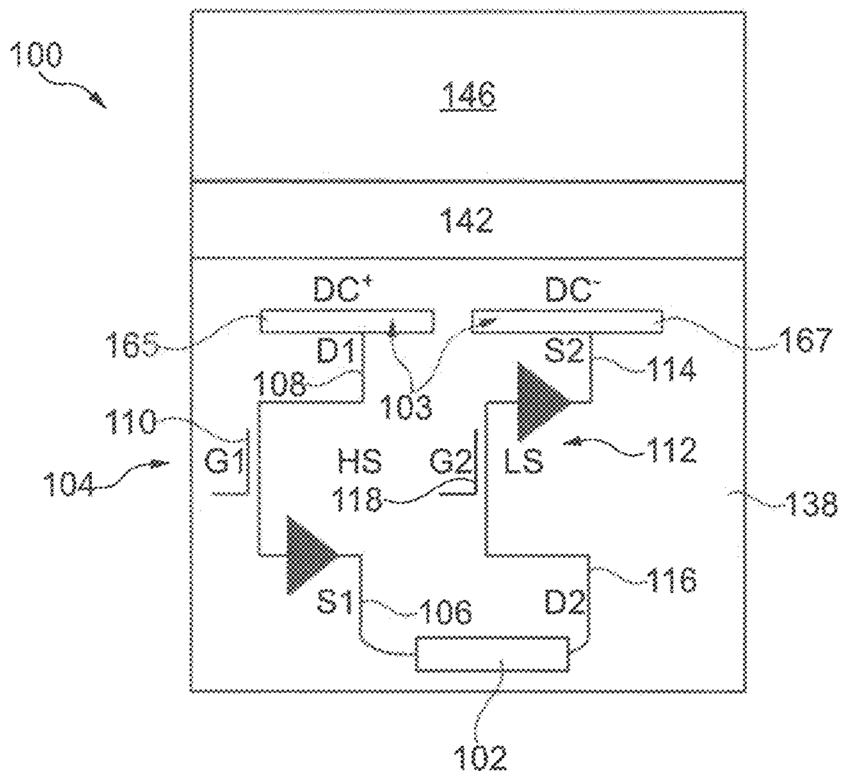
FIG. 10 shows a schematic circuit diagram of a package with its interconnections according to yet another exemplary embodiment.
Figure 11:
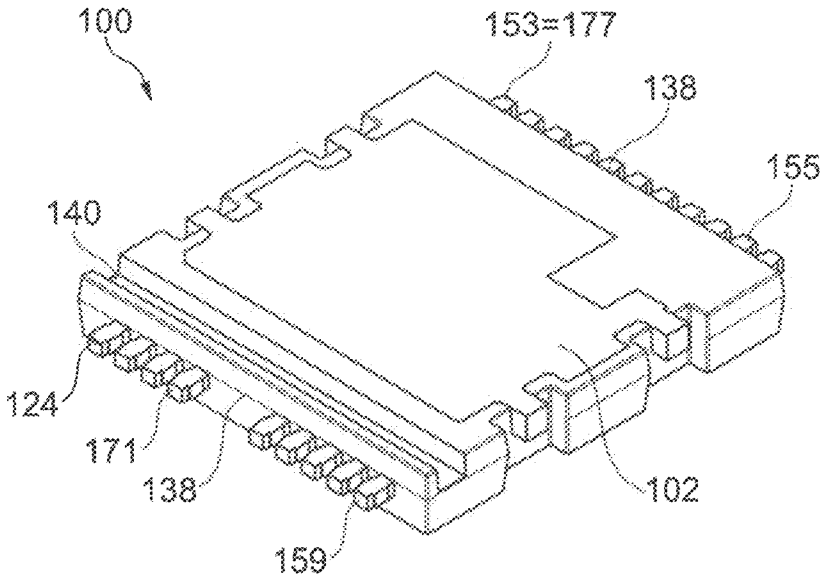
FIG. 11 shows a three-dimensional opaque view of the package according to FIG. 10.
Figure 12:
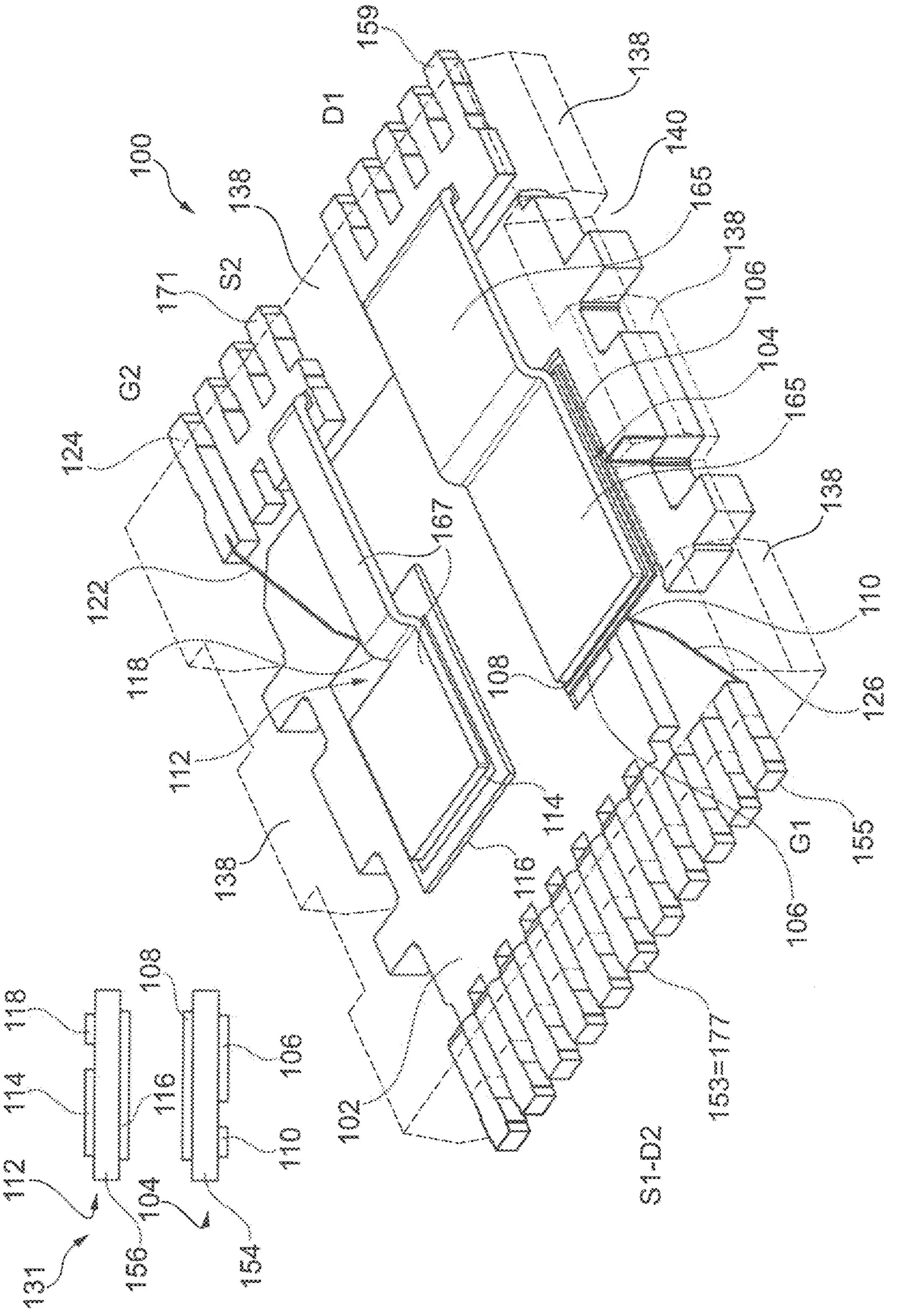
FIG. 12 shows a three-dimensional transparent view of the package according to FIG. 10.

Still referring to the aforementioned embodiment, the first chip may be a source-down chip and may function as a high-side chip, and the second chip may be a drain down chip and may function as a low-side chip. Such an embodiment is shown in FIG. 10 to FIG. 12.

As already mentioned, the first chip and the second chip may be connected to form a half bridge. In the context of the present application, the term “half bridge” may particularly denote a circuit composed of an upper transistor switch (“high-side”) and a lower transistor switch (“low-side”). For instance, the transistors may be MOSFETs, i.e. metal oxide semiconductor field effect transistors. The transistors may be connected in a cascode arrangement. The two transistor switches may be turned on and off complementary to each other (in particular with a non-overlapping dead-time) by applying corresponding voltage waveforms at the control terminals. A desired result may be an idealized DC-DC conversion scenario, where a square-wave mid voltage level switches between a first electric potential (such as a DC (direct current) bus voltage) and a second electric potential (such as ground). However, other shapes of an output signal may be possible which do not have a square-wave characteristic. The two transistors may be interconnected with a mutual connection of their connection terminals so that a two-transistor based switch with implemented diode characteristic may be obtained. The mentioned half bridge configuration may be used as such or alone or may be combined with one or more further half bridges (or other electric circuits) to realize a more complex electric function. For instance, two such half bridges may form a full bridge.

In an embodiment, the first chip is a source-down chip and functions as a low-side chip, and the second chip is a drain down chip and functions as a high-side chip. Corresponding embodiments are shown in FIG. 5 to FIG. 9.

In an embodiment, at least part of the conductive structure is exposed from the encapsulant at a surface opposite to another surface where at least part of the carrier is exposed from the encapsulant, wherein the insulating layer is arranged on the exposed surface of the at least part of the carrier, wherein the package comprises a further insulating layer arranged on the exposed surface of the conductive structure, and wherein a thickness of the further insulating layer is larger than a thickness of the insulating layer. Hence, the package may be configured for double-sided cooling. In such a configuration, both the carrier as well as the conductive structure may be exposed with respect to the encapsulant and may be covered with a respective insulating layer. When the fixed potentials are present on the carrier side and the floating potentials are present on the conductive structure side, a thinner insulating layer may be sufficient on the carrier side. A thin insulating layer is advantageous but causes capacitance. However, this is not harmful if it only sees fixed or DC potential.

In another embodiment, at least part of the conductive structure is exposed from the encapsulant at a surface opposite to another surface where at least part of the carrier is exposed from the encapsulant, wherein the insulating layer is arranged on the exposed surface of the at least part of the conductive structure, wherein the package comprises a further insulating layer arranged on the exposed surface of the carrier, and wherein a thickness of the further insulating layer is larger than a thickness of the insulating layer. When the fixed potentials are present on the conductive structure side and the floating potentials are present on the carrier side, a thinner insulating layer may be sufficient on the conductive structure side.

In an embodiment, the one of the conductive structure (which may for example be composed of different conductive elements or which may be an integral clip) or the carrier (which may for example be composed of different die pads or which may be an integral carrier) on which the insulating layer is arranged (for example with direct physical contact) is at at least one fixed potential (for instance at two different fixed potentials) during operation of the package. In contrast to this, the other one of the conductive structure or the carrier on which the insulating layer is not arranged may be at at least one floating potential (for example corresponding to a switching node of a half bridge) during operation of the package. Advantageously, this may lead to reduced capacitive coupling caused by a parasitic capacitor formed between a metallic heat sink on the insulating layer and a metallic carrier or conductive body on its opposing other side. Consequently, the insulating layer may be formed very thin.

In an embodiment, the package is configured for applying said fixed potential(s) to the one of the conductive structure or the carrier on which the insulating layer is arranged for suppressing capacitive coupling. More specifically, this may be done to suppress capacitive coupling between the carrier or conductive structure attached to one side of the insulating layer and a heat sink attached to the other side of the insulating layer. To put it shortly, this may allow to achieve a reduction of the capacitive coupling between package carrier (or conductive structure) and heat sink with the insulating layer in between.

Thus, a preferred feature of exemplary embodiments is to apply the thin insulating layer on a fixed potential of a half-bridge package. This may suppress undesired phenomena of a parasitic capacitor (having said insulating layer as capacitor dielectric) and may lead to less unintentional current induction and a proper EMI behavior.

In an embodiment, the insulating layer has a thickness in a range from 10 μm to 100 μm, and comprises a ceramic material (for example aluminum oxide, aluminum nitride, boron nitride and/or aluminium oxynitride) or an organic material (for example prepreg).

More generally, the insulating layer may have a thickness in a range from 1 μm to 500 μm, for example in a range from 15 μm to 70 μm or in a range from 20 μm to 50 μm. Particularly the ranges of smaller thicknesses may become possible due to the configuration of the package according to exemplary embodiments.

In an embodiment, the package has a voltage class in a range from 650 V to 2000 V. Due to the excellent protection of the package again creepage current and electric breakdown, the package is compliant with even demanding requirements concerning electric stability. For promoting a high-voltage class, the encapsulant may also be provided with one or more creepage-distance increasing grooves for extending a length and a complexity of a creepage path along an exterior of the package.

In an embodiment, the insulating layer has a thermal conductivity of at least 1 W/mK, for example at least 50 W/mK, preferably at least 100 W/mK. Hence, the thermal conductivity of the material of the insulating layer may be significantly better than the thermal conductivity of a typical mold compound. Thus, the insulating layer may contribute significantly to the heat removal out of the package.

For example, it is possible that the encapsulant is embodied as a single encapsulation body which covers all the mentioned elements. Alternatively, it is possible to provide separate encapsulation bodies for the different chips.

In an embodiment, the encapsulant is selected from a group consisting of a mold compound, and a laminate. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity, may be embedded in an epoxy-based matrix of the encapsulant.

In an embodiment, the package is configured as tie bar-less package. In such an embodiment, the entire package may be entirely free of any tie bar. This may simplify the manufacturing process and may improve the electric reliability of the package, since no metallic tie bar material will then form part of the exterior surface of the package. The absence of tie bars at a package surface may improve electric reliability. Tie bar-less embodiments may be advantageous when high voltages are used.

However, embodiments without or with tie bars are possible. For example in a split die pad design, tie bars may be present to avoid significant mold flash due to a tilting die pad during molding. Here, methods such as retractable pins, vacuum mold tool, etc., may be advantageous.

In an embodiment, the first chip and the second chip are made by the same chip technology. It is even possible that the first chip and the second chip are identical. In an embodiment, the first chip and the second chip have the same shape and dimension. In other words, the first chip and the second chip may be substantially identical semiconductor chips. When the two chips (providing the transistors) of the half bridge type package are identical in terms of shape, dimension and electric performance, it is sufficient to provide only one type of transistor chip for manufacturing the package. The advantage of this measure is simplicity. Using only one type of chips for providing the transistor functionality keeps the manufacturing effort of the package low.

Alternatively, the first chip and the second chip may have at least one of different shapes and different dimensions. Thus, it is also possible that the two chips have different sizes and/or different electric performance, for instance to take into account different duty cycles of the chips, or for enabling a separate optimization of a DC-DC functionality. For example in asymmetric half bridges, high-side and low side chips may have different sizes to allow a lower RDSON for the die which is longer in an ON state.

In an embodiment, at least one of the first chip and the second chip is configured for operation with a vertical current flow (in particular a current flow perpendicular to a plane within which the carrier and/or conductive structure extends). Chips being configured for a vertical current flow may have transistor terminals both at an upper main surface and a lower main surface, respectively, of the chip. In particular in such a vertical flow configuration, the package can be formed with extremely short current paths and thus with a quite simple layout.

The described circuit architectures with the single chip and with two chips connected to form a half bridge can be realized with many different package types. More specifically, various different package architectures are compatible with the described connection architecture with compact layout and short electric paths. For instance, a PQFN package type is compatible with the described connection technology, as well as a HSOF package technology. In other embodiments, a Dual Sided Small Outline (DSO) package may be provided. Also a Quad Package (having pins on all four sides of the package) may be formed according to an exemplary embodiment. Therefore, the mentioned layout design can be easily adapted to various different package technologies.

In an embodiment, the chip(s) with transistor is/are configured as power semiconductor chips. Thus, a corresponding chip (such as semiconductor chip) may be used for power applications for instance in the automotive field and may for instance have at least one integrated insulated-gate bipolar transistor (IGBT) and/or at least one transistor of another type (such as a MOSFET, a JFET, etc.). Such integrated circuit elements may be made for instance in silicon technology or based on wide-bandgap semiconductors (such as silicon carbide, gallium nitride or gallium nitride on silicon). A semiconductor power package may comprise inverter circuits, half bridges, full-bridges, drivers, logic circuits, etc.

As substrate or wafer forming the basis of the chip(s), a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

The illustration in the drawing is schematically.

Before describing further exemplary embodiments in further detail, some basic considerations will be summarized based on which exemplary embodiments have been developed.

According to an exemplary embodiment, a package comprises a carrier, a conductive structure, and a first chip (such as a field-effect transistor chip or a bipolar transistor chip) which may be encapsulated by an encapsulant. The first chip may have terminals or pads at both opposing main surfaces thereof. At least one thermally conductive and electrically insulating layer on an exposed surface portion of the conductive structure and/or of the carrier may enhance electric reliability and thermal performance of the package. Preferably, a source-down (or emitter-down) first chip may be provided, wherein the thin insulating layer can be formed on an exposed carrier (such as a leadframe) and/or conductive structure (such as a clip). This may allow to provide a high performance and high reliability package being manufacturable with reasonable effort.

In one preferred embodiment, the package may be a discrete package with a single encapsulated die (see FIG. 1 to FIG. 4).

In other preferred embodiments (see FIG. 5 to FIG. 12), the package additionally comprises a second transistor chip having terminals formed on both opposing main surfaces thereof. Particularly preferred may be, in a half bridge application, a combination of a source-down first chip and a drain-down second chip. An advantage of such embodiments may be due an exemplary configuration in which a terminal of the first chip and a terminal of the second chip may have fixed potentials during operation, which allows the use of a very thin insulating layer on an exposed carrier or an exposed conductive structure connected with said fixed potentials terminals without compromising on electric reliability and thermal performance. A package side corresponding to floating terminals of the chips may need, when carrier or conductive structure is exposed here, a thicker insulating layer. Forming the insulating layer on the fixed potentials side of the package may therefore lead to a compact design and nevertheless an excellent electric and thermal reliability. Having insulating layers both on an exposed carrier and on an exposed conductive structure may enable double-sided cooling.

In particular, the following four embodiments are provided:

A first embodiment relates to a single-die package, having a source-down die and a thin insulating layer placed on its drain side (FIG. 1 to FIG. 4).

Second to fourth embodiments relate to half-bridge packages:

A second embodiment (FIG. 5 and FIG. 6) has two separated die pads, one source-down die functioning as low-side die, and one drain-down die functioning as the high-side die. Furthermore, a thin insulating layer may be placed on the drain side of the high-side die and the source side of the low-side die. Furthermore, two separate clips may be integrated in the package.

A third embodiment (FIG. 7 to FIG. 9) has two separated die pads, one source-down die functioning as low-side die, one drain-down die functioning as high-side die, a thin insulating layer placed on the drain side of the high-side die and source side of the low-side die, and a single integrated clip.

A four embodiment (FIG. 10 to FIG. 12) has an integrated die pad, one source-down die functioning as high-side die, one drain-down die functioning as low-side die, two separated clips respectively connecting to two fixed potentials, and one or two insulating layers covering the two clips.

According to an exemplary embodiment, it may be possible to avoid a capacitive shift current at thin package insulating layers:

Power components are switching and controlling big currents and voltages. Consequently they generate also losses resulting in heat which needs to be dissipated. The overall tendency to increase power density makes it more difficult to get rid of the heat. For many power components the collector or drain or plus-connection is mounted to a carrier which can be a substrate or a tin like a leadframe. This leadframe side is used as heat spreader and heat transportation to a dissipation area like a heat sink but as the component is dealing with high voltages, it needs an isolation to the heat sink. However, the arrangement leadframe-isolation-heat sink creates a parasitic capacitor. As the component is continuously switching and voltage is moving up and down, for high voltage discretes may be some kilovolt with fast transient time, there is a shift current over this capacitor. This current can reach high values (for example several Amperes) or charge and discharge a heat sink, in any case causing severe electromagnetic interference endangering proper function of an application. For thermal management, the insulating layer should be as thin as possible with respect to the voltage isolation, but to reduce the capacitor current, the isolation has to be thick to reduce the capacitance to a tolerable value.

An exemplary embodiment provides a solution to align these opposing needs. A very thin insulating layer, which may be attached to an exposed metallic surface, may be provided stable enough for high voltage isolation. For example, such a thin insulating layer may be made from ceramic material. A concrete example for the insulating layer may be AlON as ceramic material deposited on a copper leadframe with a layer thickness of 25 μm for isolation up to 1500 V or more. The capacitance of such a layer may be in the range of 140 $pF/cm^2$. A resulting current Ic can be calculated from the equation Ic=C*dV/dt (C capacitance, V voltage, t time), for upcoming fast switching applications dV/dt can reach even 100 V/ns. Calculating with these values, a resulting spike current of 14 A may occur.

Conventionally, corresponding problems did not appear so hard as lower switching speeds have been used and processes for thin insulating layers have not yet been available, but with modern components like a SiC chip.

Since MOSFET switching speed is growing, heat dissipation needs to be improved and thin isolation materials and processes are advantageous. To avoid resulting high current in the range of several Ampere, it may be advantageous to keep the potential change of the connected leadframe low or at zero. A source-down configuration may offer such conditions to make use of thin insulating layers.

Applications according to exemplary embodiments may use one, two or three half bridge configurations with one switch on high side (HS) and one switch on low side (LS). Power switches may have the collector or drain on their backside connected to a carrier (such as a substrate or leadframe). The HS-emitter/source may then be connected to the LS-collector/drain. But the collector/drain is on the carrier side and may create a capacitance with described negative effects. For avoiding this, the LS-emitter/source may be mounted to the carrier.

With this source down design, there may be only direct current potentials (also denoted as fixed potentials) on the carrier side, and HS-emitter/source and LS-collector/drain may be located upside, both driving the load with fast changing potentials, but the backside/carrier layers stay on direct current level.

Such an approach may make it possible to apply a thin insulating layer to the other side of the carrier because the resulting capacitance is only loaded by direct current voltages, no noteworthy derivative of the voltage is then present at the carrier.

A corresponding approach may be applied with single switches in using one classical drain/collector-down switch and one source/emitter-down switch, both isolated by a thin insulating layer.

Another embodiment relates to a monolithically integrated GaN topology which is isolated by a very thin ceramic layer deposited on the leadframe.

Exemplary embodiments may make use of the fast-switching capability of SiC MOSFETs to reduce losses. This may allow to create off-board-chargers. This may also allow to obtain a highly efficient heat dissipation.

An exemplary embodiment may provide a package which combines a source-down assembly with an insulating layer having a thickness below 50 μm, for example deposited on a leadframe. The usage of a source-down configuration may enable implementation of a thin insulating layer for compliance with a challenging low thermal resistance to the heat sink. The source-down design prevents issues concerning coupling capacitance on system level.

A preferable thickness range for the insulating layer may be from 10 μm to 50 μm, more preferably in a range from 10 μm to 30 μm. Preferably, a thickness of the insulating layer may be below 200 μm. Appropriate materials for the insulating layer may be ceramic aluminum oxide, aluminum nitride, aluminum oxi-nitride, boron nitride. However, also organic materials can be used as a material for the insulating layer. This may allow to manufacture packages complying with a voltage class range from 650 V to 2000 V. Packages according to exemplary embodiments may reduce capacitive losses and may achieve compliance with demanding EMI (electromagnetic interference) requirements.

In the following description of the figures, exemplary embodiments will be described for a field effect transistor having source, drain and gate terminals. However, a person skilled in the art will understand that these and other embodiments can also be constructed as a bipolar transistor having emitter (rather than source), collector (rather than drain) and base (rather than gate) terminals.

Figure 2:
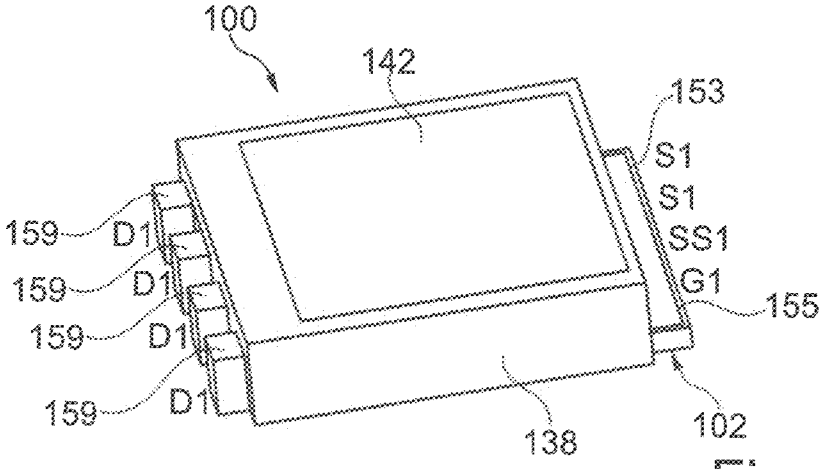
FIG. 2 shows a three-dimensional view of the package according to FIG. 1.
Figure 3:
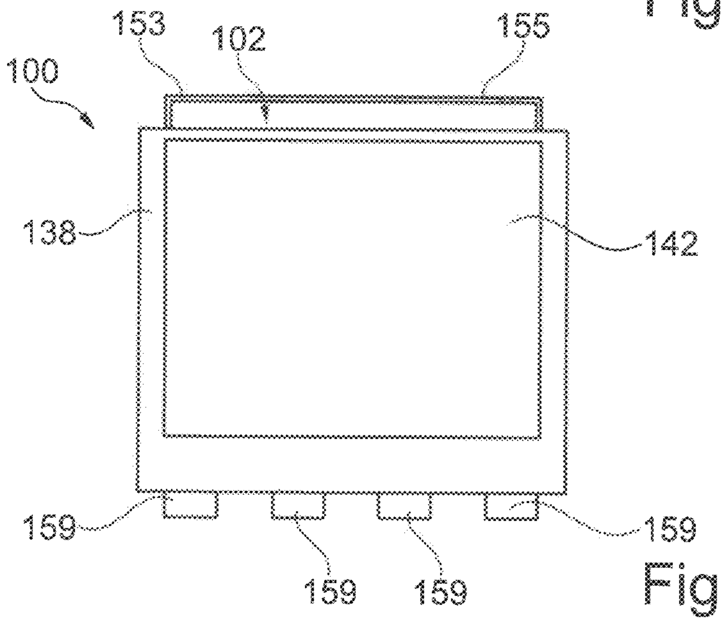
FIG. 3 shows a top view of the package according to FIG. 1.
Figure 4:
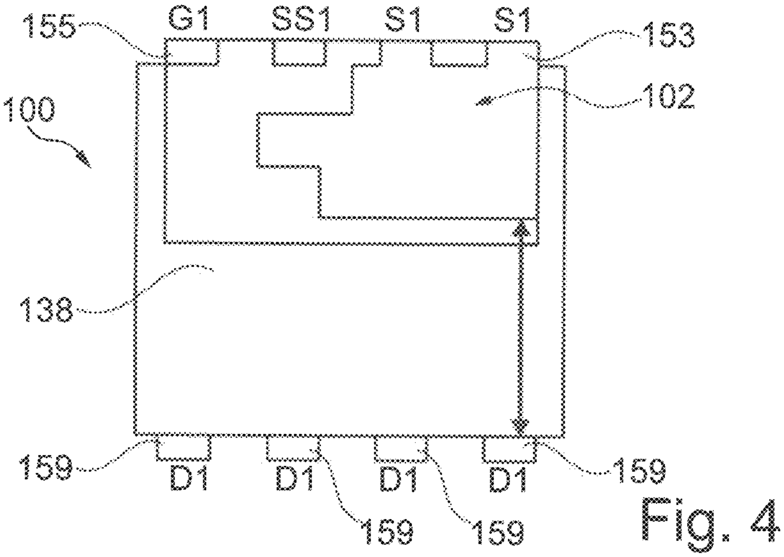
FIG. 4 shows a bottom view of the package according to FIG. 1.

FIG. 1 shows a cross-sectional view of a single die package 100, and a detail 193 thereof, according to an exemplary embodiment. FIG. 2 shows a three-dimensional view of the package 100 according to FIG. 1. FIG. 3 shows a top view of the package 100 according to FIG. 1. FIG. 4 shows a bottom view of the package 100 according to FIG. 1.

The package 100 according to FIG. 1 comprises a carrier 102, which is here a laminate-type printed circuit board (PCB). Carrier 102 comprises dielectric regions 195 (for example comprising resin and glass fibers) and metallic regions 197 (such as patterned copper layers and copper vias or pillars). To put it shortly, carrier 102 may be embodied as a PCB with fitting contact layers. Advantageously, carrier 102 embodied as a PCB or a laminate may have routability from source/gate pads of below described first chip 104 to source/gate leads of the package 100.

A single or first chip 104, which may be a power semiconductor die, is mounted on the carrier 102 and is provided with an integrated field-effect transistor (or alternatively with an integrated bipolar transistor). First chip 104 may be a semiconductor chip, for instance manufactured in silicon carbide or gallium nitride technology (for instance implementing a vertical GaN chip architecture). The first chip 104 is assembled on the carrier 102, for instance by soldering or sintering.

The first chip 104 may be a power semiconductor transistor chip which may comprise a monolithically integrated MOSFET (or alternatively an IGBT), not shown. As shown in a separate illustration 199, the transistor of first chip 104 may be monolithically integrated in a semiconductor body 154, for instance comprising silicon or silicon carbide. The first chip 104 comprises a first terminal 106 (being a source terminal indicated as S1) which is attached on the carrier 102. Moreover, the first chip 104 comprises a second terminal 108 (being a drain terminal indicated as D1) and a third terminal 110 (being a gate terminal indicated as G1). As shown in illustration 199, the first terminal 106 and the third terminal 110 are formed on one common main surface of the first chip 104 which faces the carrier 102. In contrast to this, the second terminal 108 is formed on an opposing other main surface of the first chip 104 which faces away from the carrier 102. The first chip 104 may be configured to experience a vertical current flow between its opposing main surfaces during operation of the package 100. A control signal may be applied to the third terminal 110 to control operation of the first chip 104.

Moreover, an optional source sense terminal may be provided at first chip 104, which is denoted as SS1.

As mentioned, the first terminal 106 and the third terminal 110 are attached on the carrier 102. In contrast to this, the second terminal 108 may be attached to an electrically conductive structure 103, which is here embodied as metallic clip. Hence, first chip 104 may be embodied as a source-down die, its source and gate pads being arranged on a bottom surface of the die and being arranged on the top surface of the carrier 102. The drain pad of first chip 104 is arranged on a top side of the die.

The conductive structure 103 can be a leadframe or, as in FIG. 1, a clip. The conductive structure 103 is arranged on top of the drain pad of the source-down first chip 104 and extends out of an encapsulant 138 as drain lead.

Mold-type encapsulant 138 encapsulates part of the carrier 102, the entire first chip 104, and part of the conductive structure 103.

An upper main surface and a lateral portion of the conductive structure 103 extend beyond the encapsulant 138 and are thereby exposed.

An insulating layer 142 is arranged on the exposed upper surface portion of the conductive structure 103. Advantageously, the insulating layer 142 may be provided with a very small vertical thickness D in a range from 10 μm to 100 μm. The insulating layer 142 may be thermally conductive and electrically insulating. For example, the insulating layer 142 may be made of a ceramic (such as boron nitride), an organic material (for instance prepreg), or a thermal interface material (TIM). Such a thermal interface material 142 may for instance be a thermal paste providing a thermal coupling with a heat sink 146 with low thermal resistance in between. Due to its thermal conductivity, the insulating layer 142 may contribute to the dissipation of heat from an interior of the package 100, wherein said heat may be generated predominantly by the first chip 104. Moreover, the insulating layer 142 may contribute to electric safety.

The portion of the conductive structure 103 which protrudes laterally from the encapsulant 138 functions as a second terminal lead 159, i.e. a lead connected to the second terminal 108.

For example, the above-mentioned heat sink 146 may comprise a thermally conductive plate 160 from which a plurality of cooling fins 162, also made of a thermally conductive material, extend upwardly. Preferably, heat sink 146 may be made of a metal or a ceramic to provide a high thermal conductivity. Heat generated by the first chip 104 may be dissipated via the conductive structure 103, the insulating layer 142 and the heat sink 146 to an environment, for instance by air cooling. It is also possible that the heat sink 146 is embodied as a liquid cooler (for instance may be a water cooler), etc.

Again referring to the carrier 102, the latter has an electrical routing structure 151 extending between two opposing main surfaces of the carrier 102 and connecting the first terminal 106 with a first terminal lead 153 and the third terminal 110 with a third terminal lead 155. Both the first terminal lead 153, i.e. the lead connected with the first terminal 106, and the third terminal 155, i.e. the lead connected with the third terminal 110, are exposed with respect to the encapsulant 138 for attachment to a bottom-sided mounting base 191, for example a further printed circuit board (PCB). The mounting base 191 may be connected to a bottom main surface of the encapsulant 138 and of the carrier 102.

Moreover, the carrier 102 comprises a plurality of parallel thermal channels 157 arranged below the first chip 104 and extending over the entire vertical extension of the carrier 102 for dissipating heat from the first chip 104 to a side of the carrier 102 facing away from the conductive structure 103. The thermal channels 157 may for instance be embodied as thermal vias filled with copper material. In other words, the thermal channels 157 may be vias for heat transmission.

Furthermore, reference sign 101 in FIG. 1 schematically illustrates a creepage current path which is sufficiently long and complex to efficiently suppress the risk of creepage current.

The PCB- or laminate-type carrier 102 has, on its bottom surface, at least one source lead, one gate lead and an optional source sense lead. The carrier 102 comprises at least a first conductive path connecting the source pad of the first chip 104 from the top surface of the carrier 102 to the bottom surface of the carrier 102 and then to the source terminal of the package 100. Furthermore, carrier 102 comprises at least a second conductive path connecting the gate pad of the first chip 104 to the gate lead of the package 100. These conductive paths may comprise traces, vias and pads on at least one side of the carrier 102 and within the carrier 102. Furthermore, the first chip 104 may comprise a source sense pad, and the package 100 may have a source sense lead. Apart from this, the carrier 102 may comprise a third conductive path connecting the source sense pad and the source sense lead through the carrier 102. The source lead, the gate lead and the source sense lead may be at least partially covered by an insulating material, for example a solder mask.

The package 100 illustrated in FIG. 1 is an SMD (surface mounted device) package. The drain leads are arranged at a first side of the package 100 opposite to a second side where the source leads, gate lead and the optional source sense lead are arranged.

Hence, FIG. 1 illustrates a semiconductor package 100 comprising carrier 102 and first power semiconductor chip 104, comprising first terminal 106 and third terminal 110 arranged on a first side of the first chip 104 and second terminal 108 arranged on a second side of the first chip 104 opposite to the first side. The first terminal 106 comprises an emitter terminal or a source terminal. The second terminal 108 comprises a collector terminal or a drain terminal. The first terminal 106 is arranged to be attached on a first surface of the carrier 102. Conductive structure 103 is attached on the second terminal 108 of the first chip 104. Encapsulant 138 is configured to encapsulate part of the carrier 102, the first chip 104 and part of the conductive structure 103. Another part of the conductive structure 103 is exposed from a first surface of the package 100. Insulating layer 142 is arranged on an exposed surface of the conductive structure 103, wherein the insulating layer 142 comprises a thermally conductive and electrically insulating layer. The insulating layer 142 may have a thickness, D, in the range from 10 μm to 100 μm, and may comprise a ceramic material (for example aluminum oxide, aluminum nitride, boron nitride and/or aluminium oxynitride), or an organic material (for example prepreg). Alternatively, insulating layer 142 may have has a thickness, D, in a range from 1 μm to 500 μm, 15 μm to 70 μm, or 20 μm to 50 μm.

The carrier 102 comprises a PCB, a laminate or a leadframe. Carrier 102 may be configured to provide an electrical routability of connecting the first terminal 106 of the first chip 104 to first terminal lead 153 of the package 100 and the third terminal 110 of the first chip 104 to third terminal lead 155 of the package 100, from the first surface of the carrier 102 to an opposite second surface of the carrier 102. The carrier 102 further comprises at least one thermal channel 157 for dissipating heat from the first chip 104 to the bottom of the package 100. At least part of the first terminal lead 153 and the third terminal lead 155 may be exposed from the bottom surface of the package 100 and are to be electrically attached to another carrier in form of mounting base 191, preferably a PCB. The conductive structure 103 comprises a clip or another leadframe, protrudes from the encapsulant 138 and functions as a second terminal lead 159 (i.e. as collector lead or drain lead) of the package 100. Heat sink 146 is attached on the insulating layer 142.

Next, the above mentioned second, third and fourth embodiments will be explained: Each of said embodiments relates to a first chip 104 and a second chip 112 connected in a half-bridge configuration and being embodied as a high-side die and a low-side die. In some of these embodiments, a drain terminal D2 of the second chip 112 and a source terminal S1 of the first chip 104 are separated and may be covered by a (for example separated or continuous) thin insulating layer 142. Advantageously, D2 and S1 may have fixed potentials when the package 100 is in operation. An external heat sink 146 can be attached on top of the thin insulating layer 142. The terminals S2 and D1 may be connected with each other internally in the package 100.

In the second embodiment (FIG. 5 and FIG. 6), two separated die pads of a carrier 102 may be exposed, and two separated clips of a conductive structure 103 may be provided. The first chip 104 may be arranged in a source-down configuration and may function as the low-side die. The second chip 112 may be arranged in a drain-down configuration and may function as the high-side die. The two die pads may have a fixed potential and may be exposed, therefore the thin insulating layer 142 may be applied here.

In the third embodiment (FIG. 7 to FIG. 9), two separated die pads of a carrier 102 may be exposed. One integrated clip may be foreseen as conductive structure 103. The first chip 104 may be arranged in a source-down configuration and may function as the low-side die. The second chip 112 may be arranged in a drain-down configuration and may function as the high-side die. The two die pads may have a fixed potential and may be exposed, therefore the thin insulating layer 142 may be applied here.

In the fourth embodiment (FIG. 10 to FIG. 12), one integrated die pad may be provided as carrier 102. Two separated clips may be exposed and may form the conductive structure 103. The first chip 104 may be arranged in a source-down configuration, and may function as the high-side die. The second chip 112 may be arranged in a drain-down configuration, and may function as the low-side die. The two clips of the conductive structure 103 may have a fixed potential and may be exposed, so that the thin insulating layer 142 may be applied on the clips.

In the context of the present application, the term "source-down chip" may denote a chip or die with its source pad or terminal attached on a die pad or other kind of carrier. Therefore, if the source pad is attached to a clip, a corresponding chip will not be interpreted by a person skilled in the art as a source-down die.

Figure 5:
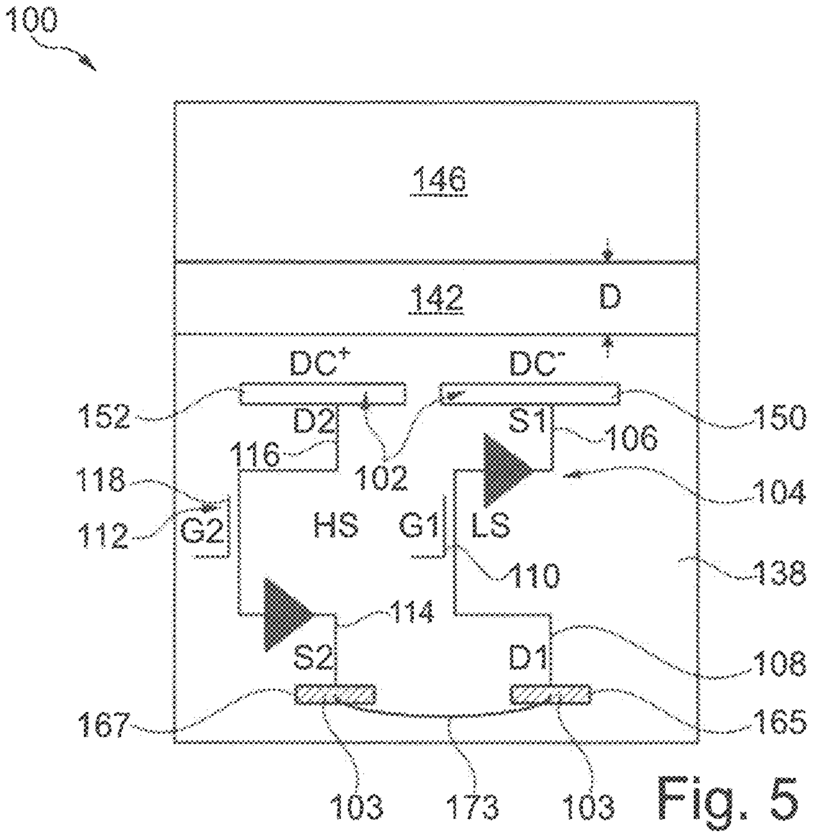
FIG. 5 shows a schematic circuit diagram of a package with its interconnections according to another exemplary embodiment.

FIG. 5 shows a schematic circuit diagram of a package 100 with its interconnections according to an exemplary embodiment. FIG. 6 shows a three-dimensional transparent view of the package 100 according to FIG. 5.

The package 100 according to FIG. 5 and FIG. 6 comprises a leadframe-type carrier 102 composed of a metallic first die pad 150 and a separate metallic second die pad 152.

A first chip 104, which may be a power semiconductor chip, has an integrated field-effect transistor. The first chip 104 comprises a first terminal 106, which is a first source terminal S1, and which is attached on the first die pad 150 of the carrier 102. A second terminal 108, which is a first drain terminal D1, and a third terminal 110, which is a first gate terminal G1, are provided as well on the first chip 104. The first terminal 106 and the third terminal 110 are formed on one main surface of the first chip 104, whereas the second terminal 108 is formed on an opposing other main surface of the first chip 104. The first chip 104 is configured for a vertical current flow between its terminals on its opposing main surfaces.

In addition, package 100 according to FIG. 5 and FIG. 6 comprises a second chip 112 with an integrated transistor. The second chip 112 comprises a fourth terminal 114, which is a second source terminal S2, a fifth terminal 116, which is a second drain terminal D2 and which is attached on the carrier 102, and a sixth terminal 118, which is a second gate terminal G2. The fourth terminal 114 and the sixth terminal 118 are formed on one main surface of the second chip 112 and the fifth terminal 116 is formed on an opposing other main surface of the second chip 112. The fifth terminal 116 is attached on the second die pad 152 of the carrier 102. The second chip 112 is configured for a vertical current flow between its terminals on its opposing main surfaces.

Furthermore, package 100 according to FIG. 5 and FIG. 6 comprises a conductive structure 103 which is split into a first conductive element 165 and a separate second conductive element 167. The first conductive element 165 is attached on the second terminal 108. The second conductive element 167 is attached on the fourth terminal 114.

An encapsulant 138, such as a mold compound, partially encapsulates the carrier 102, fully encapsulates the first chip 104, fully encapsulates the second chip 112, and fully or partially encapsulates the conductive structure 103.

A thermally conductive and electrically insulating layer 142, which may be embodied as in the above described first embodiment, may be arranged on an exposed surface portion of the carrier 102. More specifically, insulating layer 142 may cover the exposed surface portions of the first die pad 150 and of the second die pad 152. Hence, the insulating layer 142 is arranged on the exposed surface of the carrier 102.

The first chip 104 and the second chip 112 are connected in a half-bridge configuration. In this half bridge configuration, the first chip 104 is a source-down chip and functions as a low-side chip, and the second chip 112 is a drain-down chip and functions as a high-side chip. During operation, the second terminal 108 and the fourth terminal 114 are configured as a switch node of the package 100 and therefore have a floating potential, compare FIG. 5. In contrast to this, the first terminal 106 and the fifth terminal 116 are configured to have fixed potentials DC+ and DC−, respectively, see FIG. 5. The insulating layer 142 is arranged on the exposed first die pad 150 and the exposed second die pad 152 having the fixed potentials DC+, DC−. In view of said fixed potentials DC+, DC− directly below insulating layer 142, the latter may be formed with a small vertical thickness, D, of less than 100 μm. On top of the insulating layer 142, a heat sink 146 may be attached, as described above.

During operation of package 100, the exposed first and second die pads 150, 152, which are covered by the insulating layer 142 having, in turn, heat sink 146 thereon, are at fixed electric potentials DC+, DC− (rather than at a floating electric potential as switching node-type conductive elements 165, 167 of conductive structure 103). In view of said fixed potentials DC+, DC−, the impact of the parasitic capacitance formed by metallic die pads 150, 152 and metallic heat sink 146 with insulating layer 142 in between are not pronounced. More precisely, the capacitive coupling of the fixed potential die pads 150, 152 with metallic heat sink 146 via the dielectric in form of insulating layer 142 is advantageously weak or reduced compared with a scenario in which pads 150, 152 were at a floating potential. Due to this reduced capacitive coupling, it may be advantageously possible to provide insulating layer 142 with small thickness, D, for example in a range from 10 μm to 100 μm. To put it shortly, the embodiment of FIG. 5 and FIG. 6 provides a thin insulating layer 142 directly on fixed potential pads 150, 152. This may reduce unintentional current induction and may lead to an advantageous EMI behavior.

In the embodiment of FIG. 5 and FIG. 6, the conductive structure 103 comprises said conductive element 165 connected with the first chip 104 and said separate further conductive element 167 connected with the second chip 112. Each of conductive elements 165, 167 may be embodied as a respective clip which may be connected with each other by an electrically conductive connecting element 173.

Now referring to the three-dimensional illustration of package 100 in FIG. 6, the package 100 further comprises a first terminal lead 153 (i.e. a lead connecting to first terminal 106), a second terminal lead 159 (i.e. a lead connecting to second terminal 108), a third terminal lead 155 (i.e. a lead connecting to third terminal 110), a fourth terminal lead 171 (i.e. a lead connecting to fourth terminal 114), a fifth terminal lead 177 (i.e. a lead connecting to fifth terminal 116), a sixth terminal lead 124 (i.e. a lead connecting to sixth terminal 118), and the above-mentioned connecting element 173.

As shown, the conductive element 165 is connected to the second terminal lead 159. Furthermore, the further conductive element 167 is attached on the fourth terminal 114 and is connected to the fourth terminal lead 171. The connecting element 173 is embedded inside the encapsulant 138 and connects the second terminal lead 159 to the fourth terminal lead 171 via an inside of the package 100. Apart from this, the second terminal lead 159 and the fourth terminal lead 171 are arranged at a first side of the package 100, and the first terminal lead 153 and the fifth terminal lead 177 are arranged at an opposite second side of the package 100. Moreover, a direct connection structure 179 is arranged to directly electrically connect the second terminal 108 below the conductive element 165 and the fourth terminal 114 below the further conductive element 167 inside the encapsulant 138.

As shown in FIG. 6, third terminal lead 155 is electrically connected with the third terminal 110 by a third terminal connection element 122. After encapsulation by a mold-type encapsulant 138, the third terminal lead 155 will extend partially beyond the encapsulant 138 to enable an electric coupling with an electronic periphery of package 100. In the illustrated embodiment, the third terminal connection element 122 may be a bond wire extending between the third terminal 110 and the third terminal lead 155. As shown in FIG. 6, said bond wire may extend above or may protrude beyond the chip mounting surface of the carrier 102.

Moreover, package 100 comprises sixth terminal lead 124 being electrically connected with the sixth terminal 118 by a sixth terminal connection element 126. In the illustrated embodiment, the sixth terminal connection element 126 may be a further bond wire extending between the sixth terminal 118 and the sixth terminal lead 124.

Hence, the embodiment of FIG. 5 and FIG. 6 provides a semiconductor package which comprises two separated die pads 150, 152. Additionally, two separated clips are provided as conductive elements 165, 167. A first chip 104, embodied as source-down low-side die, has its source pad arranged on a first surface of the first die pad 150. Its gate pad is arranged at the same side as the source pad but does not touch the first die pad 150. Its drain pad is arranged on an opposite side of the first chip 104 and faces away from the first die pad 150.

What concerns the second chip 112, said die is arranged in a drain-down high-side configuration. The drain pad is arranged on a first surface of the second die pad 152, its source pad and gate pad are arranged on an opposite side of the die. The second surfaces of the first die pad 150 and of the second die pad 152 are exposed from the package 100. The thin insulating layer 142 (which may comprise two individual sections for the individual die pads 150, 152) may be arranged on top of the exposed second surface of the carrier 102.

Conductive element 165 being embodied as first clip is arranged to connect the drain pad of the first chip 104 to a drain lead (D1 of the package 100). Further conductive element 167 being embodied as a second clip is arranged to connect the source pad of the second chip 112 to a second source lead (S2 of the package 100), wherein the drain lead D1 and the source lead S2 are connected via a connecting element 173, which is embedded inside the package 100.

What concerns the thin insulating layer 142, its first and second sections can be separated from each other, or the first insulating layer 142 may be embodied as an integrated part.

The package 100 according to FIG. 5 and FIG. 6 comprises a plurality of first source leads (S1) and a plurality of second drain leads (D2), the plurality of first source leads and the plurality of second drain leads respectively having different fixed potentials when the package 100 is configured with a half-bridge circuitry and is operated correspondingly. The package 100 has a plurality of first drain leads and a plurality of second source leads, which are arranged at one side of the package 100, and can connect to each other via the internal conductive element (for example, a metal bar or part of leadframe). Terminal D1 of the first chip 104 and terminal S2 of the second chip 112 may have the same electric potential due to the direct connection of the first and second clips (see reference signs 165, 167) by the internal connecting element 173. An additional conductive element (denoted as direct connection structure 179, for example, a wire or a clip, shown in the middle of the two clips in FIG. 6) directly connect the top surface of the first and second clips, or the drain pad of the first chip 104 and the source pad of the second chip 112. The top surface of the first and second clips can be embedded into the mold compound, or may be partially exposed from the bottom surface of the package 100. The package 100 according to FIG. 5 and FIG. 6 may be embodied as an SMD package.

Again referring to FIG. 6, the bottom side in FIG. 6 may be the top side of the package 100, on which an external heat sink 146 may be attached.

The semiconductor package 100 of FIG. 6 comprises first die pad 150 and second die pad 152 of a common leadframe structure. The first die pad 150 and the second die pad 152 may be made of conductive metal. The fifth terminal 116 of the second chip 112 is attached on a first surface of the second die pad 152. The first and the second die pads 150, 152 are exposed from the top surface of the package 100. A first insulating layer section is arranged on top of the exposed surface of the first die pad 150, and a second insulating layer section is arranged on top of the exposed surface of the second die pad 152. The first die pad 150 and the second die pad 152 are separated from each other, so that the first insulating layer section and the second insulating layer section can be separated from each other, or may form an integrated insulating layer.

The first conductive element 165 may be attached on the second terminal of the first chip 104 and may be configured to connect to a first drain lead of the package 100. The second conductive element 167 may be attached to the source terminal of the second chip 114 and may connect to a second source lead of the package 100. Connection element 173 may be embedded inside the encapsulant 138 and may connect the first drain lead of the package 100 to the second source lead of the package 100 via an inside of the package 100.

Direct connection element 179 may be arranged to directly connect the drain terminal of the first chip 104 and the source terminal of the second chip 112 inside the encapsulant 138.

A first gate element may connect the gate terminal of the first chip 104 to a first gate lead of the package 100. Correspondingly, a second gate element may connect the gate terminal of the second chip 112 to a second gate lead of the package 100.

According to FIG. 5 and FIG. 6, the first die pad 150 may protrude out of the encapsulant 138 and may be formed as a first source lead of the package 100. Accordingly, the second die pad 152 may protrude out of the encapsulant 138 and may be formed as a second drain lead of the package 100.

Figure 7:
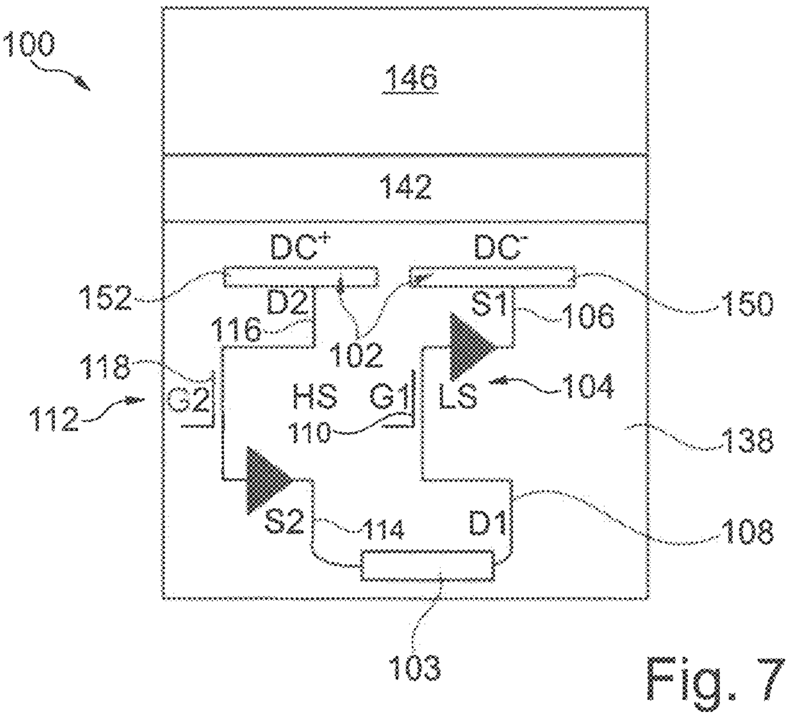
FIG. 7 shows a schematic circuit diagram of a package with its interconnections according to still another exemplary embodiment.
Figure 8:
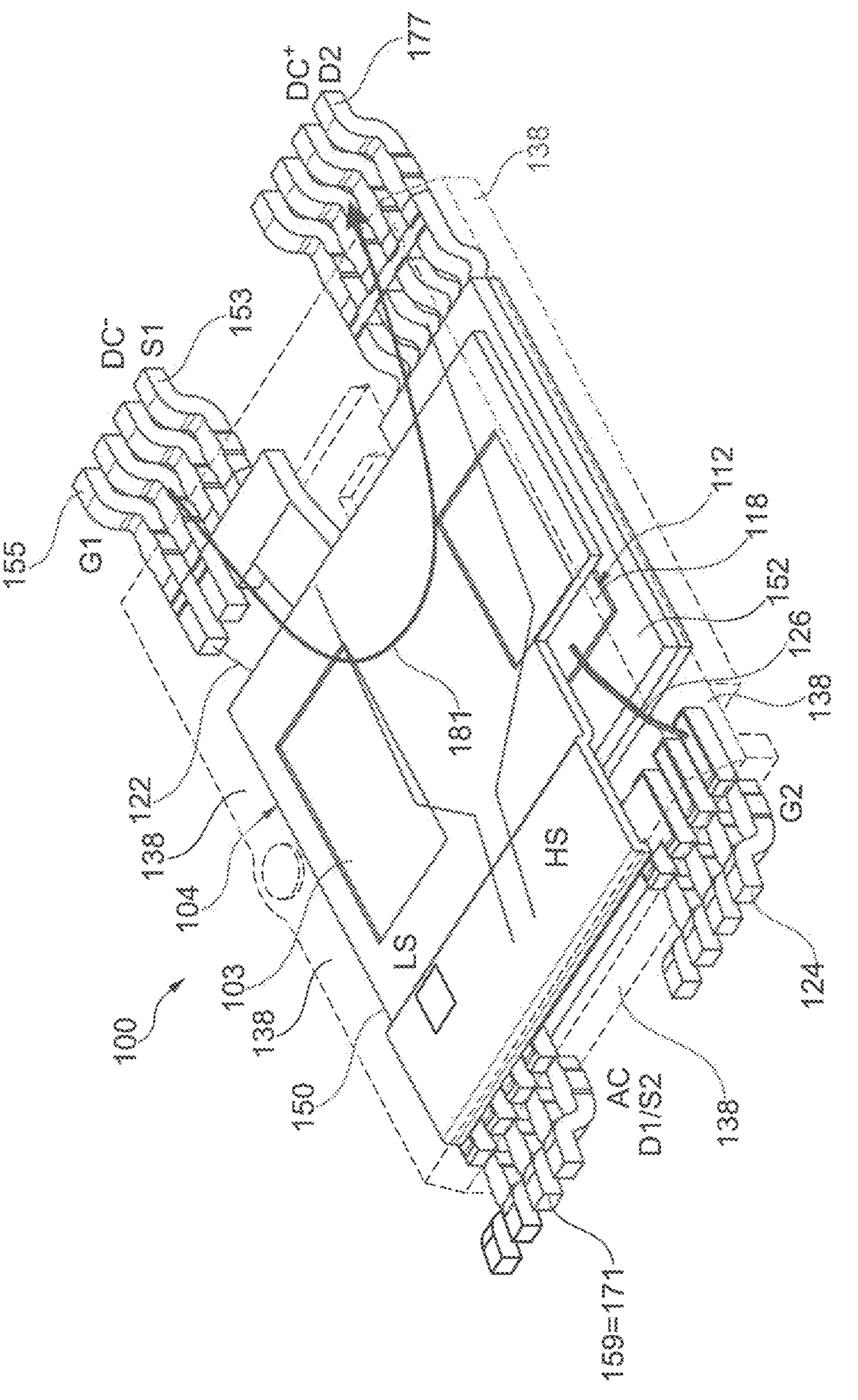
FIG. 8 shows a three-dimensional transparent view of the package according to FIG. 7.
Figure 9:
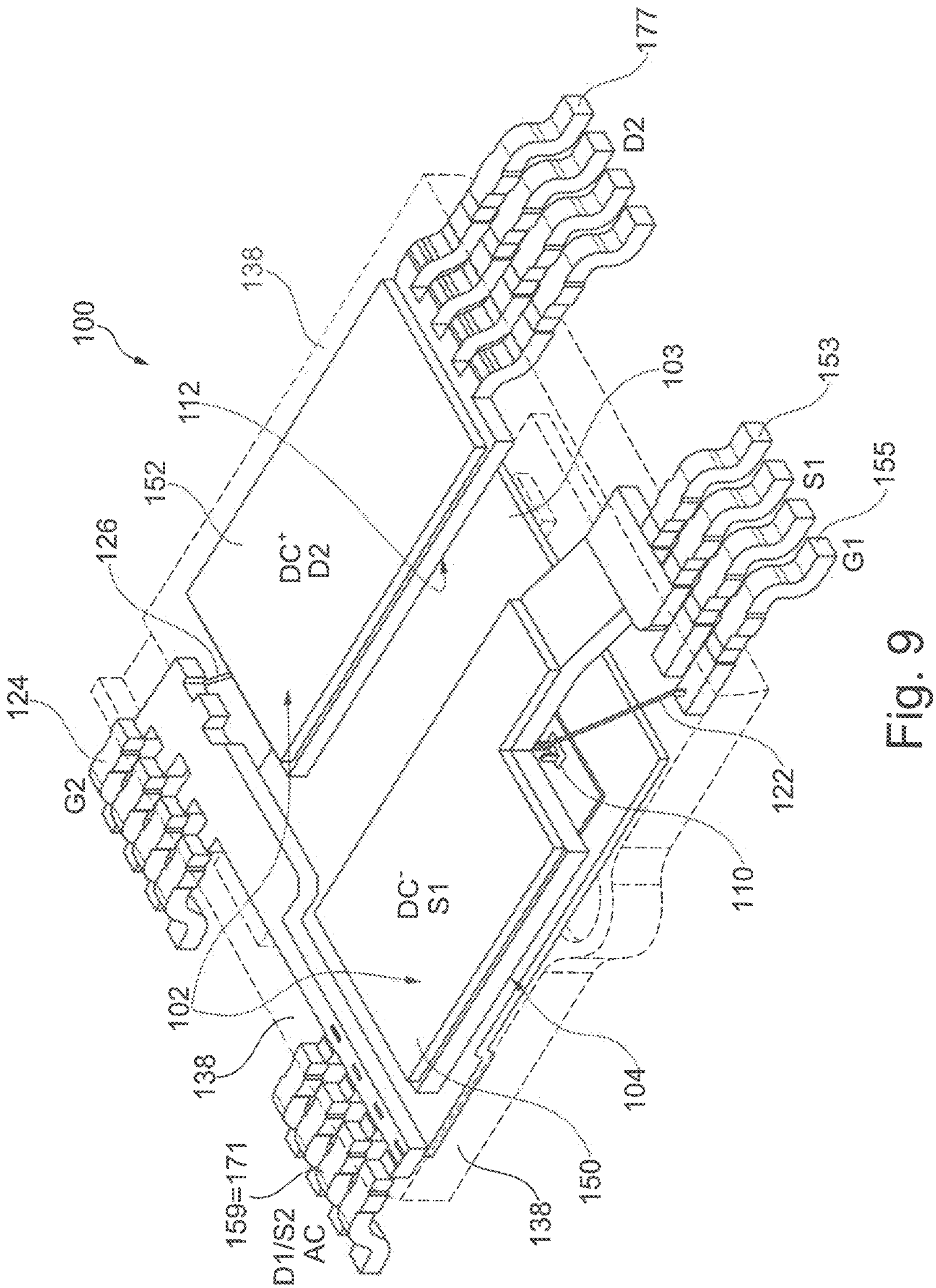
FIG. 9 shows another three-dimensional transparent view of the package according to FIG. 7.

FIG. 7 shows a schematic circuit diagram of a package 100 with its interconnections according to still another exemplary embodiment. FIG. 8 shows a three-dimensional transparent view of the package 100 according to FIG. 7. FIG. 9 shows another three-dimensional transparent view of the package 100 according to FIG. 7.

The embodiment according to FIG. 7 to FIG. 9 differs from the embodiment according to FIG. 5 and FIG. 6 in particular in that, according to FIG. 7 to FIG. 9, the conductive structure 103 comprises a single integrated clip contacting the second terminal 108 and the fourth terminal 114. Thus, no connection elements 173, 179 need to be provided in FIG. 7 to FIG. 9.

According to FIG. 7 to FIG. 9, the conductive structure 103 is a common clip and is connected with both the first chip 104 and the second chip 112. More specifically, the second terminal 108 (which is a drain terminal) is directly connected with the common clip-type single integral conductive structure 103. Moreover, the fourth terminal 114 (which is a source terminal) of the second chip 112 is directly connected with the same main surface of the common clip-type single integral conductive structure 103 as the second terminal 108 of the first chip 104.

In addition to the common clip-type single integral conductive structure 103, the embodiment of FIG. 7 to FIG. 9 comprises a leadframe-type chip carrier 102 on which the other main surfaces of the first chip 104 and the second chip 112 are mounted. More specifically, the chip carrier 102 comprises a first die pad 150 on which the first chip 104 is mounted and comprises a second die pad 152 on which the second chip 112 is mounted.

An encapsulant 138, such as a mold compound, may encapsulate the common clip-type conductive structure 103, the first chip 104 and the second chip 112. Moreover, encapsulant 138 may only partially encapsulate the chip carrier 102 in such a way that one main surface of the first die pad 150 and one main surface of the second die pad 152 are exposed beyond the encapsulant 138. The exposed main surfaces of the first die pad 150 and of the second die pad 152 may oppose a respectively other main surface of the first die pad 150 and of the second die pad 152 being connected to the chips 104, 112. Optionally, also a surface portion of conductive structure 103 may be exposed beyond the encapsulant 138. Said exposed main surfaces may contribute to removal of heat generated by the chips 104, 112 during operation of package 100.

For efficiently removing heat and simultaneously ensuring electric isolation (and consequently electric reliability) of package 100, insulating layer 142 may be arranged on the exposed main surfaces of the first die pad 150 and the second die pad 152. A heat sink 146 may be arranged on the insulating layer 142 for enhancing the heat removal capability of package 100. As shown, the single integral electrically conductive structure 103 faces away from the insulating layer 142.

During operation of package 100, the exposed first and second die pads 150, 152, which are covered by the insulating layer 142 having heat sink 146 thereon, are at fixed electric potentials DC+, DC− (rather than at a floating electric potential as switching node-type conductive structure 103 embodied as single integrated clip). In view of said fixed potentials DC+, DC−, the impact of the parasitic capacitance formed by metallic die pads 150, 152 and metallic heat sink 146 with insulating layer 142 in between are not very pronounced. More precisely, the capacitive coupling of the fixed potential die pads 150, 152 with metallic heat sink 146 via the dielectric in form of insulating layer 142 is advantageously weak or reduced compared with a scenario in which pads 150, 152 were at a floating potential. Due to this reduced capacitive coupling, it may be advantageously possible to provide insulating layer 142 with small thickness, D, for example in a range from 10 μm to 100 μm. To put it shortly, the embodiment of FIG. 7 to FIG. 9 provides a thin insulating layer 142 directly on fixed potential pads 150, 152.

As best seen in FIG. 9, the die pad 152 physically connects the D2 pad with the D2 leads (see reference sign 177) as a single integral metal structure.

In FIG. 7 to FIG. 9, clip-type conductive structure 103 may be attached to the leads according to reference sign 159/171, for example by soldering, glue, etc., so that two different metal pieces may be present.

The embodiment of FIG. 7 to FIG. 9 provides an improved loop inductance for the illustrated integrated half bridge package 100. What concerns loop inductance, the DC loop may be reduced significantly according to FIG. 7 to FIG. 9 in comparison with conventional approaches. In particular, it may be beneficial that a spatial clip extension may be obtained along the DC path to suppress performance detrimental magnetic fields (so as to obtain advantageous properties in terms of eddy currents).

According to FIG. 7 to FIG. 9, a common single clip is provided as single common electrically conductive structure 103. This may lead to a full switch node potential collection from the high-side second chip 112 and the low-side first chip 104. Advantageously, only DC potentials DC+, DC− are present on exposed die pads 150, 152. Moreover, the illustrated clip design ensures a high ampacity. Furthermore, the clip extension may suppress magnetic fields which may be detrimental in terms of performance. Advantageously, the clip extension does not contribute to the effective current path, but acts as a magnetic field suppressing element by allowing induced eddy currents to extend into. Apart from this, the shown design may lead to a small commutation loop, as illustrated by reference sign 181 in FIG. 8.

Thus, an integrated half-bridge package 100 with improved electrical performance can be obtained. Consequently, ease of package handling on a user side can be accomplished.

Especially for silicon carbide technologies, the improvements in electrical performance are significant. In particular, the package design according to FIG. 7 to FIG. 9 may allow to pair a high current density with a low package inductance. Advantageously, package 100 may allow to reduce or even minimize an electrical figure of merits, such as loop inductance.

To put it shortly, the embodiment of FIG. 7 to FIG. 9 provides an integrated semiconductor package 100 in half-bridge configuration with one power chip assembled face-up and one power chip assembled face-down. Advantageously, the switch node potential (illustrated in FIG. 7 to FIG. 9 as D1/S2 or AC, for alternating current) of both power chips 104, 112 is interconnected directly to the clip-type single integral electrically conductive structure 103. Advantageously, the embodiment of FIG. 7 to FIG. 9 relies on a power interconnect technology which can be a single clip architecture.

Advantageously, the clip structure forming conductive structure 103 in FIG. 7 to FIG. 9 extends over the die dimensions in the direction where it is not electrically connected, to form an eddy-current plate.

In the embodiment according to FIG. 7 to FIG. 9, an integrated clip is arranged on the drain pad of the first chip 104 and the source pad of the second chip 112. The bottom side in FIG. 8 may relate to the top side of the package 100, wherein an external heat sink 146 (not shown in FIG. 8) is attached on the thin insulating layer 142. Moreover, the top side in FIG. 9 may be the top side of the package 100, wherein the external heat sink 146 is attached on the thin insulating layer 142.

As seen in FIG. 8 and FIG. 9, the package 100 has a plurality of second terminal leads 159 and a plurality of fourth terminal leads 171, which are arranged at one side of the package 100, and are connected to each other via the integrated clip. Terminal D1 of the first chip 104 and terminal S2 of the second chip 112 have the same potential due to the integrated clip.

The integrated clip can be embedded into the mold compound, or may be partially exposed from the bottom surface of the package 100.

The clip may also protrude from the package 100 and may form a plurality of fourth terminal leads 171 (corresponding to terminal S2) and a plurality of second terminal leads 159 (relating to terminal D1), wherein terminals S2 and D1 may be connected via the clip inside the package 100. Alternatively, the integrated conductive body 103 may be arranged on a plurality of fourth terminal leads 171 (corresponding to terminal S2) and a plurality of second terminal leads 159 (relating to terminal D1). Hence, the clip may also be a separated component from the leadframe.

The plurality of fifth terminal leads 177 (relating to terminal D2) and the plurality of first terminal leads 153 (corresponding to terminal S1) respectively have a different fixed potential (DC+ or DC−) when the package 100 is configured in a half-bridge circuitry.

The clip can be embedded into the mold compound. Alternatively, the clip can be exposed from a surface of the package 100, said surface being opposite to another surface of the package 100 where carrier 102 is exposed. Additionally, a further insulating layer (see reference sign 143 in FIG. 14) can be arranged on top of the conductive structure 103, but its thickness may be thicker than the thickness of insulating layer 142 on top of fixed potential terminals D2, S1. Additionally a second heat sink can be arranged on top of the further insulating layer 143. The integrated clip-type conductive structure 103 can be arranged to contact the second terminal 108 of the first chip 104 and the fourth terminal 114 of the second chip 112 simultaneously.

When in operation with the shown half-bridge configuration, the second terminal lead 159 and the fourth terminal lead 171 of the package 100 are configured as a switch node of the package 100, and therefore have floating potential. In contrast to this, the first terminal lead 153 and the fifth terminal leads 177 are configured to have fixed potentials compared with the floating potential of the second terminal lead 159 and the fourth terminal lead 171. Therefore, the insulating layer 142 (or individual insulating layer sections) are arranged on the exposed first die pad 150 and the exposed second die pad 152 having the fixed potentials.

FIG. 10 shows a schematic circuit diagram of a package 100 with its interconnections according to still another exemplary embodiment. FIG. 11 shows a three-dimensional opaque view of the package 100 according to FIG. 10. FIG. 12 shows a three-dimensional transparent view of the package 100 according to FIG. 10.

According to FIG. 10 to FIG. 12, the carrier 102 comprises an integrated die pad of a leadframe. Construction of the first chip 104 and of the second chip 112 are shown in a detail 131 of FIG. 12. Corresponding to semiconductor body 154 of the first chip 104, also the second chip 112 is provided with a corresponding semiconductor body 156 in which a field effect transistor may be monolithically integrated.

First terminal 106 and fifth terminal 116 are attached to integrated die pad-type carrier 102 and have a floating electric potential during operation of package 100. Second terminal 108 is attached to a conductive element 165 of conductive structure 103 and has a fixed potential DC+ during operation of package 100. Fourth terminal 114 is attached to further conductive element 167 of conductive structure 103 and has a fixed potential DC− during operation of package 100. In the illustrated half bridge configuration, the source-down first chip 104 operates as high-side chip, whereas drain-down second chip 112 operates as low-side chip. Thus, when operating the package 100 in a half-bridge configuration of the first chip 104 and the second chip 112, the first terminal lead 153 and the fifth terminal lead 177 are configured as switch nodes and have a floating potential. Second terminal lead 159 connected to the conductive element 165 and fourth terminal lead 171 connected to the further conductive element 167 have fixed potentials DC+, DC−, respectively.

As shown in FIG. 12, the integrated die pad-type carrier 102 protrudes out of the encapsulant 138 and thereby forms exposed first terminal lead 153 and fifth terminal lead 177 of the package 100.

Surface portions of the conductive element 165 and of the further conductive element 167 are exposed with respect to the encapsulant 138. An insulating layer 142 may be formed to cover an exposed surface of the conductive element 165 and of the further conductive element 167, and a heat sink 146 (not shown) may be attached thereto. The insulating layer 142 may be a single layer covering both conductive elements 165, 167 or may comprise two separate sections, each assigned to a respective one of conductive elements 165, 167.

Figure 15:
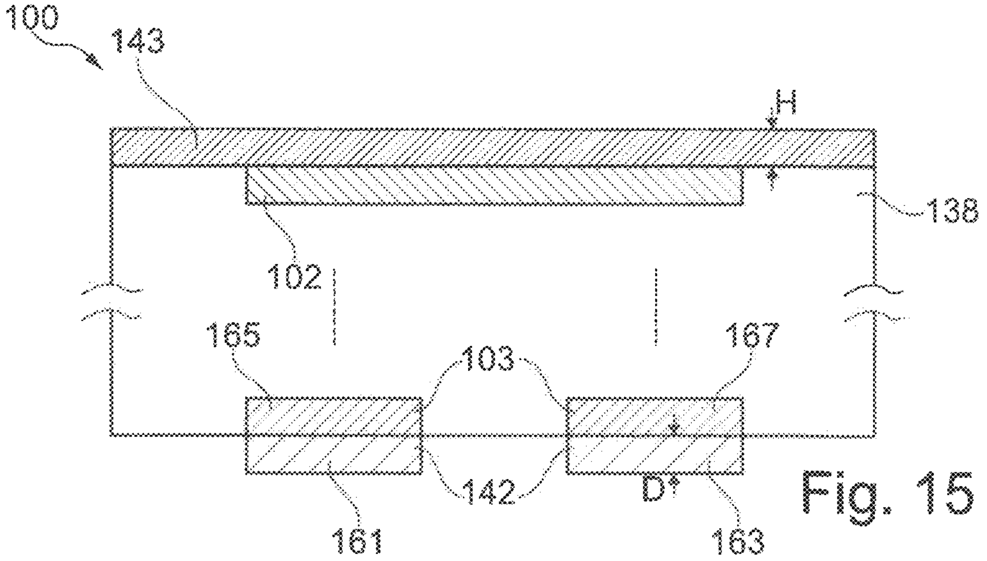
FIG. 15 shows a cross-sectional view of a package which is a variant of the embodiment of FIG. 10 to FIG. 12.

Although not shown, the package 100 may comprise a further insulating layer 143 which may be arranged on an exposed surface of the carrier 102 (see FIG. 15). A thickness H of the further insulating layer 143 on floating potential-carrier 102 may be larger than a thickness D of the insulating layer 142 on fixed potentials-conductive structure 103.

Hence, packages 100 according to exemplary embodiments may comprise an integrated conductive body, i.e. in the presently described embodiment a common die pad-type carrier 102, in the embodiment of FIG. 7 to FIG. 9 a common clip-type conductive structure 103.

Again referring to FIG. 10 to FIG. 12, conductive element 165 embodied as a first clip is arranged on top of the drain pad of the first chip 104 and connects to a plurality of a second terminal leads 159. Further conductive element 167 embodied as a second clip is arranged on top of the source pad of the second chip 112 and connects to a plurality of a fourth terminal leads 171. Both clips may be exposed at one surface of the package 100. A (separated or integrated) thin insulating layer 142 may be arranged on the exposed part of the clips.

The top side in FIG. 12 may be the top side of the package 100 (the two clips are exposed on top), wherein an external heat sink 146 may be attached on the thin insulating layer 142 (both not shown). The bottom side in FIG. 11 may be the top side of the package 100.

Referring to FIG. 12, the integrated carrier 102 protrudes from the encapsulant 138 and forms a plurality of first terminal leads 153 (corresponding to terminal S1) and a plurality of fifth terminal leads 177 (relating to terminal D2), wherein terminals S2 and D1 are connected via their internal part with the conductive elements 165, 167.

The plurality of second terminal leads 159 (corresponding to terminal D1) and the plurality of forth terminal leads 171 (relating to terminal S2) respectively have different fixed potentials when the package 100 is configured into a half-bridge circuitry.

In an embodiment, carrier 102 can be embedded in the mold compound. Alternatively, carrier 102 can be exposed from a surface of the package 100 opposite to another surface of the package 100 where conductive elements 165, 167 may be exposed.

Yet another advantageous feature of package 100 is an exterior creepage distance increasing groove 140, as best seen in FIG. 12 (see also FIG. 6, FIG. 8 and FIG. 9). The creepage distance increasing groove 140 can be formed as an exterior indentation in encapsulant 138 extending along the full distance between opposing edges of encapsulant 138. Advantageously, the creepage distance increasing groove 140 may be arranged for increasing a creepage distance between, on the one hand, an exposed cooling surface of carrier 102 and, on the other hand, the lead structure 159, 171. The latter lead structures 159, 171 are spaced with respect to the carrier 102 by material of encapsulant 138, and the creepage distance increasing groove 140 is formed in this spacing region. For instance by humidity in an environment, a parasitic electrically conductive path may be created unintentionally between the exposed surface of the carrier 102 and the lead structures 159, 171. By forming the creepage distance increasing groove 140 in between, the length of the parasitic creepage path may be extended and the complexity of the parasitic creepage path may be enhanced. Thus, the creepage distance increasing groove 140 may improve the electric reliability of the package 100. Hence, the creepage distance increasing groove 140 may improve electric isolation and may render package 100 suitable for high-voltage applications.

During operation of package 100, the exposed conductive elements 165, 167 of conductive structure 103, which are covered by the insulating layer 142 having heat sink 146 thereon, are at fixed electric potentials DC+, DC− (rather than at a floating electric potential as switching node-type carrier 102). In view of said fixed potentials DC+, DC−, the impact of the parasitic capacitance formed by metallic conductive elements 165, 167 and metallic heat sink 146 with insulating layer 142 in between are not pronounced. More precisely, the capacitive coupling of the fixed potential conductive elements 165, 167 with metallic heat sink 146 via the dielectric in form of insulating layer 142 is advantageously weak or reduced compared with a scenario in which conductive elements 165, 167 were at a floating potential. Due to this reduced capacitive coupling, it may be advantageously possible to provide insulating layer 142 with small thickness, D, for example in a range from 10 μm to 100 μm. To put it shortly, the embodiment of FIG. 10 to FIG. 12 provides a thin insulating layer 142 directly on fixed potential conductive elements 165, 167.

Figure 13:
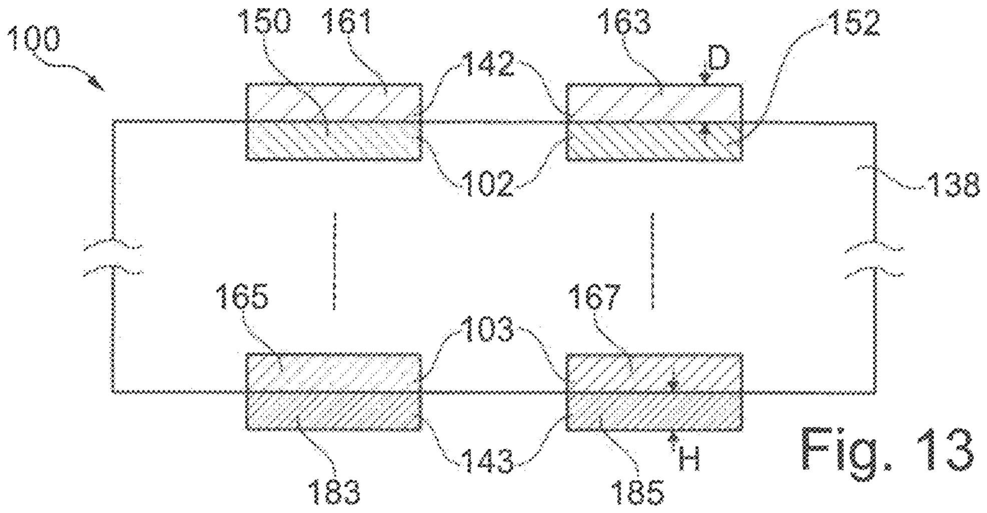
FIG. 13 shows a cross-sectional view of a package which is a variant of the embodiment of FIG. 5 and FIG. 6.
Figure 14:
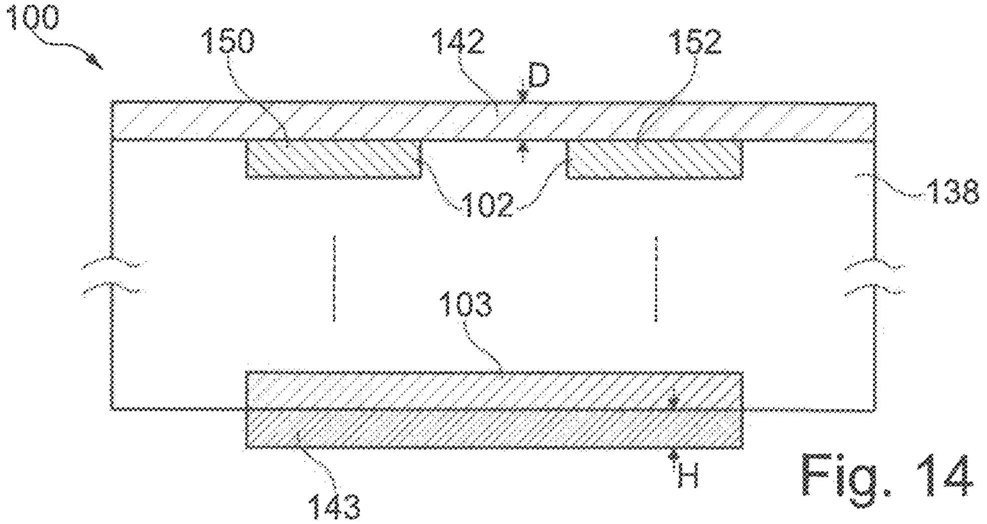
FIG. 14 shows a cross-sectional view of a package which is a variant of the embodiment of FIG. 7 to FIG. 9.

FIG. 13 to FIG. 15, which will be described in the following, relate to embodiments enabling double-sided cooling. Hence, the packages 100 according to FIG. 13 to FIG. 15 may have an excellent thermal performance. FIG. 13 to FIG. 15 show only part of the packages 100 which relate to aforementioned described embodiments in a respective double-sided cooling architecture.

FIG. 13 shows a cross-sectional view of a package 100 which is a variant of the embodiment of FIG. 5 and FIG. 6. According to FIG. 13, a first main surface of the encapsulant 138 exposes the first die pad 150 and the second die pad 152 of carrier 102. Correspondingly, a second main surface of the encapsulant 138 exposes the conductive element 165 and the further conductive element 167 of the conductive structure 103. In the shown embodiment, the insulating layer 142 comprises a first insulating layer section 161 on the first die pad 150 and comprises a separate second insulating layer section 163 on the second die pad 152. Furthermore, a further insulating layer 143 is provided which comprises a first further insulating layer section 183 on the conductive element 165 and a second further insulating layer section 185 on the further conductive element 167. Since the die pads 150, 152 are at a fixed electric potential DC+. DC− during operation of the package 100 (compare FIG. 5), dielectric layer 142 thereon may be formed with a small thickness, D, for instance below 100 μm, without a noteworthy reduction of electric reliability. In contrast to this, the thickness, H, of further insulating layer 143 should be larger than the thickness, D, since the conductive elements 165, 167 are at a floating electric potential during operation of the package 100 (compare again FIG. 5).

The embodiment of FIG. 13 may ensure double-sided cooling while at the same time providing a high electric reliability.

FIG. 14 shows a cross-sectional view of a package 100 which is a variant of the embodiment of FIG. 7 to FIG. 9 and also enables double-sided cooling.

The embodiment according to FIG. 14 differs from the embodiment according to FIG. 13 in particular in that, according to FIG. 14 the insulating layer 142 is a single integral layer extending over the first die pad 150 and over the second die pad 152, and in that the insulating layer 143 is a single integral layer extending over the conductive element 165 and over the further conductive element 167.

FIG. 15 shows a cross-sectional view of a package 100 which is a variant of the embodiment of FIG. 10 to FIG. 12.

According to FIG. 15, a first main surface of the encapsulant 138 exposes the single die carrier 102. Correspondingly, a second main surface of the encapsulant 138 exposes the conductive element 165 and the further conductive element 167 of the conductive structure 103. In the shown embodiment, the insulating layer 142 comprises a first insulating layer section 161 on the conductive element 165 and comprises a separate second insulating layer section 163 on the further conductive element 167. Furthermore, an integral continuous further insulating layer 143 is provided which covers the entire exposed surface of the carrier 102. Since the conductive elements 165, 167 are at a fixed electric potential during operation of the package 100 (compare FIG. 10), dielectric layer 142 thereon may be provided with a small thickness, D, for instance below 100 μm, without a noteworthy reduction of electric reliability. In contrast to this, the thickness, H, of dielectric layer 143 on carrier 102 should be larger than the thickness, D, since the carrier 102 is at a floating electric potential during operation of the package 100 (compare again FIG. 10).

The embodiment of FIG. 15 may ensure double-sided cooling while at the same time providing a high electric reliability.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:

a carrier;

a first chip with an integrated transistor and comprising a first terminal attached on the carrier, a second terminal, and a third terminal, wherein the first terminal and the third terminal are formed on one main surface of the first chip and the second terminal is formed on an opposing other main surface of the first chip, wherein the first terminal is a source or emitter terminal, the second terminal is a drain or collector terminal, and the third terminal is a gate or base terminal;

a conductive structure being at least partially electrically conductive and being attached on the second terminal;

an encapsulant at least partially encapsulating the carrier, the first chip, and the conductive structure; and an insulating layer arranged on a surface portion of the conductive structure or of the carrier, which surface portion is exposed beyond the encapsulant, wherein the insulating layer is thermally conductive and electrically insulating;

a second chip with an integrated transistor and comprising a fourth terminal, a fifth terminal attached on the carrier and a sixth terminal, wherein the fourth terminal and the sixth terminal are formed on one main surface of the second chip and the fifth terminal is formed on an opposing other main surface of the second chip, wherein the fourth terminal is a source or emitter terminal, the fifth terminal is a drain or collector terminal, and the sixth terminal is a gate or base terminal;

wherein the conductive structure is attached on the fourth terminal;

wherein the encapsulant encapsulates at least part of the second chip;

wherein at least part of the conductive structure is exposed from the encapsulant;

wherein the conductive structure on which the insulating layer is arranged is at least one fixed potential during operation of the package, and wherein in particular the other one of the conductive structure or the carrier on which the insulating layer is not arranged is at least one floating potential during operation of the package.

2. The package according to claim 1, wherein the carrier comprises a leadframe structure or a laminate.

3. The package according to claim 1, wherein the carrier has an electrical routing structure extending between two opposing main surfaces of the carrier and connecting the first terminal with a first terminal lead and the third terminal with a third terminal lead.

4. The package according to claim 3, wherein at least part of the first terminal lead and the third terminal are exposed with respect to the encapsulant for attachment to a mounting base.

5. The package according to claim 1, wherein the carrier comprises at least one thermal channel for dissipating heat from the first chip to a side of the carrier facing away from the conductive structure.

6. The package according to claim 1, wherein the conductive structure comprises a leadframe structure or a clip.

7. The package according to claim 1, wherein the conductive structure protrudes from the encapsulant and functions as a second terminal lead.

8. The package according to claim 1, comprising a heat sink attached on the insulating layer.

9. The package according to claim 1, wherein the carrier comprises a first die pad on which the first chip is mounted and comprises a separate second die pad on which the second chip is mounted, wherein the first die pad and the second die pad comprise an electrically conductive material.

10. The package according to claim 9, wherein the first die pad and the second die pad form part of a leadframe structure.

11. The package according to claim 1, comprising one of the following features:

wherein the insulating layer comprises a first insulating layer section on the first die pad and comprises a separate second insulating layer section on the second die pad;

wherein the insulating layer is a single integral layer extending over the first die pad and over the second die pad.

12. The package according to claim 1, wherein the conductive structure comprises a conductive element connected with the first chip and a further conductive element connected with the second chip;

wherein the package further comprises a second terminal lead, a fourth terminal lead, and a connecting element;

wherein the conductive element is connected to the second terminal lead;

wherein the further conductive element is attached on the fourth terminal and is connected to the fourth terminal lead; and wherein the connecting element is embedded inside the encapsulant and connects the second terminal lead to the fourth terminal lead via an inside of the package.

13. The package according to claim 12, wherein the second terminal lead and the fourth terminal lead are arranged at a first side of the package, and a first terminal lead and a fifth terminal lead are arranged at an opposite second side of the package.

14. The package according to claim 12, wherein at least one of the conductive element and the further conductive element comprises a clip.

15. The package according to claim 1, comprising a direct connection structure arranged to directly electrically connect the second terminal and the fourth terminal inside the encapsulant.

16. The package according to claim 1, wherein the conductive structure comprises an integrated clip contacting the second terminal and the fourth terminal.

17. The package according to claim 1, wherein the carrier comprises an integrated die pad of a leadframe;

wherein the first terminal and the fifth terminal are attached to the integrated die pad;

wherein the integrated die pad protrudes out of the encapsulant and forms a first terminal lead and a fifth terminal lead of the package;

wherein a conductive element of the conductive structure is attached to the second terminal and is connected to a second terminal lead;

wherein a further conductive element of the conductive structure is attached to the fourth terminal and is connected to a fourth terminal lead.

18. The package according to claim 17, wherein at least part of the conductive element and the further conductive element are exposed with respect to the encapsulant;

wherein the insulating layer covers an exposed surface of the conductive element and of the further conductive element.

19. The package according to claim 18, comprising one of the following features:

wherein the insulating layer comprises a first insulating layer section on the conductive element and comprises a separate second insulating layer section on the further conductive element;

wherein the insulating layer is a single integral layer extending over the conductive element and over the further conductive element.

20. The package according to claim 17, wherein, when operating the package in a half-bridge configuration of the first chip and the second chip, the first terminal lead and the fifth terminal lead are configured as switch node and have a floating potential; and wherein the package comprises a second terminal lead connected to the conductive element and comprises a fourth terminal lead connected to the further conductive element, the second terminal lead and the fourth terminal lead having fixed potentials.

21. The package according to claim 17, wherein the first chip is a source-down chip and functions as a high-side chip, and the second chip is a drain down chip and functions as a low-side chip.

22. The package according to claim 1, comprising a heat sink arranged on the insulating layer.

23. The package according to claim 1, wherein the insulating layer has a thickness in a range from 10 μm to 100 μm, and comprises one of:

a ceramic material, for example aluminum oxide, aluminum nitride, boron nitride and/or aluminium oxynitride;

an organic material.

24. The package according to claim 1, wherein the insulating layer has a thickness in a range from 1 μm to 500 μm.

25. The package according to claim 1, wherein the first chip and the second chip are connected to form a half bridge.

26. The package according to claim 25, wherein the first chip is a source-down chip and functions as a low-side chip, and the second chip is a drain down chip and functions as a high-side chip.

27. The package according to claim 1, wherein at least part of the conductive structure is exposed from the encapsulant at a surface opposite to another surface where at least part of the carrier is exposed from the encapsulant;

wherein the insulating layer is arranged on the exposed surface of the at least part of the carrier;

wherein the package comprises a further insulating layer arranged on the exposed surface of the conductive structure; and wherein a thickness of the further insulating layer is larger than a thickness of the insulating layer.

28. The package according to claim 1, wherein at least part of the conductive structure is exposed from the encapsulant at a surface opposite to another surface where at least part of the carrier is exposed from the encapsulant;

wherein the insulating layer is arranged on the exposed surface of the at least part of the conductive structure;

wherein the package comprises a further insulating layer arranged on the exposed surface of the carrier; and wherein a thickness of the further insulating layer is larger than a thickness of the insulating layer.

29. The package according to claim 1, comprising one of the following features:

wherein at least one of the first chip and the second chip is a power semiconductor chip;

wherein at least one of the first chip and the second chip is configured for operation with a vertical current flow;

wherein at least one of the first chip and the second chip is a field-effect transistor chip or a bipolar transistor chip;

wherein the package has a voltage class in a range from 650 V to 2000 V;

wherein the carrier comprises a leadframe structure or a printed circuit board;

wherein the conductive structure comprises at least one clip;

wherein the insulating layer has a thermal conductivity of at least 1 W/mK, for example at least 50 W/mK, preferably at least 100 W/mK.

30. The package according to claim 9, wherein the other one of the conductive structure or the carrier on which the insulating layer is not arranged is at at least one floating potential during operation of the package.

31. The package according to claim 1, wherein the package is configured for applying said at least one fixed potential to the one of the conductive structure or the carrier on which the insulating layer is arranged for suppressing capacitive coupling.

32. A method of manufacturing a package, the method comprising:

attaching a first terminal of a first chip, which has an integrated transistor, on a carrier;

providing the first chip with a second terminal, and a third terminal, wherein the first terminal and the third terminal are formed on one main surface of the first chip and the second terminal is formed on an opposing other main surface of the first chip, wherein the first terminal is a source or emitter terminal, the second terminal is a drain or collector terminal, and the third terminal is a gate or base terminal;

attaching a conductive structure, being at least partially electrically conductive, on the second terminal;

at least partially encapsulating the carrier, the first chip, and the conductive structure by an encapsulant; and arranging an insulating layer on a surface portion of the conductive structure or of the carrier, which surface portion is exposed beyond the encapsulant, wherein the insulating layer is thermally conductive and electrically insulating;

wherein the package further comprises a second chip with an integrated transistor and comprising a fourth terminal, a fifth terminal attached on the carrier and a sixth terminal, wherein the fourth terminal and the sixth terminal are formed on one main surface of the second chip and the fifth terminal is formed on an opposing other main surface of the second chip, wherein the fourth terminal is a source or emitter terminal, the fifth terminal is a drain or collector terminal, and the sixth terminal is a gate or base terminal;

wherein the conductive structure is attached on the fourth terminal;

wherein the encapsulant encapsulates at least part of the second chip;

wherein at least part of the conductive structure is exposed from the encapsulant;

wherein the conductive structure on which the insulating layer is arranged is at at least one fixed potential during operation of the package.

* * * * *